US006967712B2

(12) United States Patent
Sewell

(10) Patent No.: US 6,967,712 B2
(45) Date of Patent: Nov. 22, 2005

(54) APPARATUS AND SYSTEM FOR IMPROVING PHASE SHIFT MASK IMAGING PERFORMANCE AND ASSOCIATED METHODS

(75) Inventor: Harry Sewell, Ridgefield, CT (US)

(73) Assignee: ASML Holding N.V. (NL)

( * ) Notice: Subject to any disclaimer, the term of this patent is extended or adjusted under 35 U.S.C. 154(b) by 0 days.

(21) Appl. No.: 10/378,672

(22) Filed: Mar. 5, 2003

(65) Prior Publication Data

US 2003/0219096 A1 Nov. 27, 2003

Related U.S. Application Data

(60) Provisional application No. 60/361,351, filed on Mar. 5, 2002.

(51) Int. Cl.[7] .......................... G03B 27/54; G03B 27/72
(52) U.S. Cl. .......................................... 355/71; 355/67
(58) Field of Search ............................. 355/53, 67, 71; 356/124, 401

(56) References Cited

U.S. PATENT DOCUMENTS

| 5,062,705 | A | * | 11/1991 | Sato et al. .................. 356/124 |
|---|---|---|---|---|
| 5,329,333 | A | | 7/1994 | Noguchi et al. |
| 5,348,837 | A | | 9/1994 | Fukuda et al. |
| 5,756,235 | A | | 5/1998 | Kim |
| 6,016,187 | A | | 1/2000 | Noguchi et al. |
| 6,187,480 | B1 | | 2/2001 | Huang |
| 6,207,328 | B1 | | 3/2001 | Lin |
| 6,320,648 | B1 | | 11/2001 | Brueck et al. |
| 6,377,337 | B1 | | 4/2002 | Sugita et al. |
| 2002/0030802 | A1 | | 3/2002 | Sugita et al. |

FOREIGN PATENT DOCUMENTS

| DE | 197 12 281 A1 | 4/1998 |
|---|---|---|
| EP | 0 503 472 A3 | 9/1992 |
| EP | 0 503 472 A2 | 9/1992 |
| EP | 0 562 133 A1 | 9/1993 |
| EP | 1 143 492 A1 | 10/2001 |
| JP | 05-259025 | 10/1993 |
| JP | 05-315226 | 11/1993 |
| JP | 07-283130 | 10/1995 |
| JP | 10-115932 | 5/1998 |

OTHER PUBLICATIONS

"Lithography," *International Technology Roadmap for Semiconductors*, 200 Edition, pp. 1–17.

(Continued)

*Primary Examiner*—Rodney Fuller
(74) *Attorney, Agent, or Firm*—Sterne, Kessler, Goldstein & Fox P.L.L.C.

(57) ABSTRACT

A method for improving the imaging performance in a photolithographic system having a pupil plane and using a phase shift mask. A portion of the pupil plane where a phase error portion of a light from the phase shift mask is located. An aperture is placed at the located portion of the pupil plane. Typically, the phase error portion of the light from the phase shift mask is a zero order portion of the light often referred to as "zero order leakage". Blocking the zero order leakage significantly mitigates the variations in the intensity of the light that exposes photoresist that is above or below the nominal focal plane. This, in turn, reduces the variations in the linewidths formed on the wafer.

15 Claims, 16 Drawing Sheets

OTHER PUBLICATIONS

*Semiconductor Manufacturing Process*, <http://www.sematech.org/public/news/mfgproc/mfgproc.htm>, 1 page (visited Feb. 27, 2002).

Derwent Abstract Accession No. 2002-242702/30, for DE 10027984-A1, 2 pages (Dec. 20, 2001).

esp#cenet Abstract for DE 19712281, 1 page (Apr. 23, 1998).

Australian Search Report from Singapore Patent Application No. 200301100-4, 6 pages (dated Sep. 15, 2003).

English-language abstract for Japanese Patent Publication No. 2000031035, published Jan. 28, 2000, 1 page, printed from http://v3.espacenet.com.

European Search Report from European Application No. 03004859.9, filed Mar. 5, 2003, 4 pages, Search Report published May 19, 2004.

* cited by examiner

APPARATUS AND SYSTEM FOR IMPROVING PHASE SHIFT MASK IMAGING PERFORMANCE AND ASSOCIATED METHODS

CROSS-REFERENCE TO RELATED APPLICATIONS

This application claims the benefit of U.S. Provisional Application No. 60/361,351, filed Mar. 5, 2002, which is incorporated by reference herein in its entirety.

BACKGROUND OF THE INVENTION

1. Field of the Invention

The present invention relates to a method for improving the imaging performance in a photolithographic system having a pupil plane and using a phase shift mask.

2. Related Art

The ability to fabricate integrated circuit (IC) chips having devices with progressively smaller feature sizes so as to support increasingly larger densities depends upon continual evolution of photolithographic methods. On an IC chip, devices and their connections are typically fabricated in phases. Several phases include processes that modify portions of a semiconductor substrate (i.e., a wafer). For each of these phases, the portions to be processed must be isolated from the remaining portions of the wafer. Often this is accomplished by applying a layer of film (i.e., photoresist) on a surface of the wafer and exposing the photoresist to a pattern of light. The pattern distinguishes the portions of the wafer to be processed from the remaining portions. The pattern of light typically is produced by causing light to pass through a mask (i.e. a reticle) upon which the pattern is formed as opaque and transparent portions. Where light passes through the transparent portions of the reticle, corresponding portions of the photoresist are exposed. Either the exposed or unexposed (but not both) portions of the photoresist are removed to reveal the underlying portions of the wafer to be processed. The remaining portions of the wafer are protected from the process by the remaining photoresist.

Machines that cause light to pass through a reticle to expose photoresist on a wafer are referred to as wafer steppers or wafer scanners. In order to achieve an accurate representation of the reticle pattern at submicron dimensions on the photoresist, it is necessary to use a light source that can support both a high degree of resolution and depth of focus. This requirement has led to the use of lasers as light sources for photolithographic applications.

Ironically, the challenge to increase the density of devices fabricated on an IC chip is frustrated by the same smaller feature sizes upon which a greater density depends. Smaller pattern dimensions on the reticle, particularly for linewidths, cause greater diffraction of light passing through the pattern. At the wafer, this greater diffraction of light can manifest itself as "spillover", whereby the distribution of electromagnetic energies from two adjacent features merge together so that it is difficult to distinguish one feature from the other.

However, by using a phase shift mask, the distribution of electromagnetic energies from two adjacent features are out of phase with each other. Because the intensity of the light is proportional to the square of the vector sum of the amplitudes of electromagnetic energies, the use of a phase shift mask increases the likelihood that there will be a point of minimum intensity between the two adjacent features so that the can be distinguish one from the other.

Furthermore, by using a phase shift mask, the half order lights are the directions of constructive interference rather than the zero order and first order lights as are used in traditional photolithographic systems. Using the half order lights allows the spacing between features on the reticle to be reduced. Reducing the spacing between features on the reticle increases the angle of diffraction of the half order lights. The angle of diffraction can be increased so long as the half order lights are captured by the conditioning lenses of the photolithographic system.

Unfortunately, realizing a viable phase shift mask depends upon an ability to precisely fabricate recesses (or rises) in (on) the reticle having a depth (height) of an odd multiple of one half of the wavelength of the light, a specific width, and an accurate spacing from adjacent features on the reticle. Deviations from these criteria can give cause the half order lights not to be completely out of phase with each other so that the zero order light is not completely canceled by destructive interference. This phenomenon is referred to as "zero order leakage".

Zero order leakage can cause variations in the intensity of the light that exposes photoresist that is above or below the nominal focal plane. These variations in intensity, in turn, can cause variations in the linewidths formed on the wafer. Such variations in the linewidths formed on the wafer can have a detrimental effect on the electrical or electronic characteristics of the device being fabricated.

What is needed is a method of preventing zero order leakage from causing variations in the intensity of the light that exposes photoresist. Preferably, such a method should be easily implemented and inexpensive.

SUMMARY OF THE INVENTION

The present invention relates to a method for improving the imaging performance in a photolithographic system having a pupil plane and using a phase shift mask. In studying the phenomenon of zero order leakage associated with using a phase shift mask, the inventor realized that, in addition to deviations from manufacturing tolerances in the fabrication of the phase shift mask, a primary source of zero order leakage arises from the topography of the phase shift mask itself. The topography of the phase shift mask produces additional modes of diffraction that constructively interfere in the direction of the zero order light. Further recognizing that when a phase shift mask is used, the half order lights are the desired directions of constructive interference and that different orders of light converge at different areas within the pupil plane, the inventor devised a method of blocking the zero order leakage light at the pupil plane, thereby improving phase shift mask imaging performance.

In an embodiment, the present invention comprises a blocking aperture. The blocking aperture has an object translucent to a wavelength of a light and means to support the object substantially at a zero order portion of the light at a pupil plane of a photolithographic system using a phase shift mask. The means to support can include, but is not limited to, a supporting arm connected between the object and the photolithographic system, an air bearing device, and a magnetic levitation device. Preferably, the object is opaque to the wavelength the light.

Typically, the area of the object is greater than or equal to the area of the zero order portion of the light at the pupil plane. Preferably, the object has a shape that substantially corresponds to the shape of the zero order portion of the light at the pupil plane. The area can be a function of the numerical aperture of a conditioning lens of the photolithographic system or of the partial coherence of the light of the photolithographic system.

The blocking aperture can further comprise a second object translucent to the wavelength of the light and means to support the second object at a phase error portion of the light at the pupil plane. The phase error portion of the light at the pupil plane can be a function of a pitch of a pattern of a reticle used by the photolithographic system.

In another embodiment, the present invention comprises a photolithographic system. The photolithographic system includes an illumination system, a first conditioning lens, a blocking aperture, and a second conditioning lens. The illumination source is capable of causing a light to pass through a phase shift mask. The first conditioning lens is capable of causing the light from the phase shift mask to converge at a pupil plane. The blocking aperture is positioned substantially in the pupil plane and is capable of blocking a portion of the light. The second conditioning lens is capable of redirecting the light from the pupil plane to a photoresist.

The blocking aperture can be supported by a supporting arm connected between the blocking aperture and another portion of the photolithographic system, an air bearing device, a magnetic levitation device, etc. The blocking aperture is translucent to a wavelength of the light. Preferably, the blocking aperture is opaque to the wavelength of the light.

The blocking aperture is positioned at a zero order portion of the light at the pupil plane. Typically, the area of the blocking aperture is greater than or equal to the area of the zero order portion of the light at the pupil plane. Preferably, the blocking aperture has a shape that substantially corresponds to the shape of the zero order portion of the light at the pupil plane. The area can be a function of the numerical aperture of the first conditioning lens or of the partial coherence of the light between the first conditioning lens and the pupil plane.

In yet another embodiment, the present invention comprises a method for improving the imaging performance of a photolithographic system. A portion of a pupil plane where a phase error portion of a light from a phase shift mask converges is located. An aperture is placed at the located portion of the pupil plane. The phase error portion of the light can be a zero order portion of the light. Preferably, the aperture is opaque to a wavelength of the light. Preferably, the aperture allows another portion of the light to pass through the pupil plane. Preferably, the area of the aperture corresponds to the area of the located portion of the pupil plane. Preferably, the shape of the aperture corresponds to the shape of the located portion of the pupil plane.

In still another embodiment, the present invention comprises a method for improving the imaging performance of a photolithographic system. A reticle with a phase shift mask having a pattern capable of producing a phase error portion of a light with a wavelength when the light with the wavelength is passed through the reticle is selected. The phase error is capable of converging at a blocking aperture at a pupil plane. The light with the wavelength is caused to pass through the selected reticle. Preferably, a photoresist is exposed with the light caused to pass through the selected reticle.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

The preferred embodiments of the invention are described with reference to the figures where like reference numbers indicate identical or functionally similar elements. Also in the figures, the left-most digit(s) of each reference number identify the figure in which the reference number is first used.

DETAILED DESCRIPTION OF THE PREFERRED EMBODIMENTS

The present invention relates to a method for improving the imaging performance in a photolithographic system having a pupil plane and using a phase shift mask. In studying the phenomenon of zero order leakage associated with using a phase shift mask, the inventor realized that, in addition to deviations from manufacturing tolerances in the fabrication of the phase shift mask, a primary source of zero order leakage arises from the topography of the phase shift mask itself. The topography of the phase shift mask produces additional modes of diffraction that constructively interfere in the direction of the zero order light. Further recognizing that when a phase shift mask is used, the half order lights are the desired directions of constructive interference and that different orders of light converge at different areas within the pupil plane, the inventor devised a method of blocking the zero order leakage light at the pupil plane, thereby improving phase shift mask imaging performance.

Figure 1:
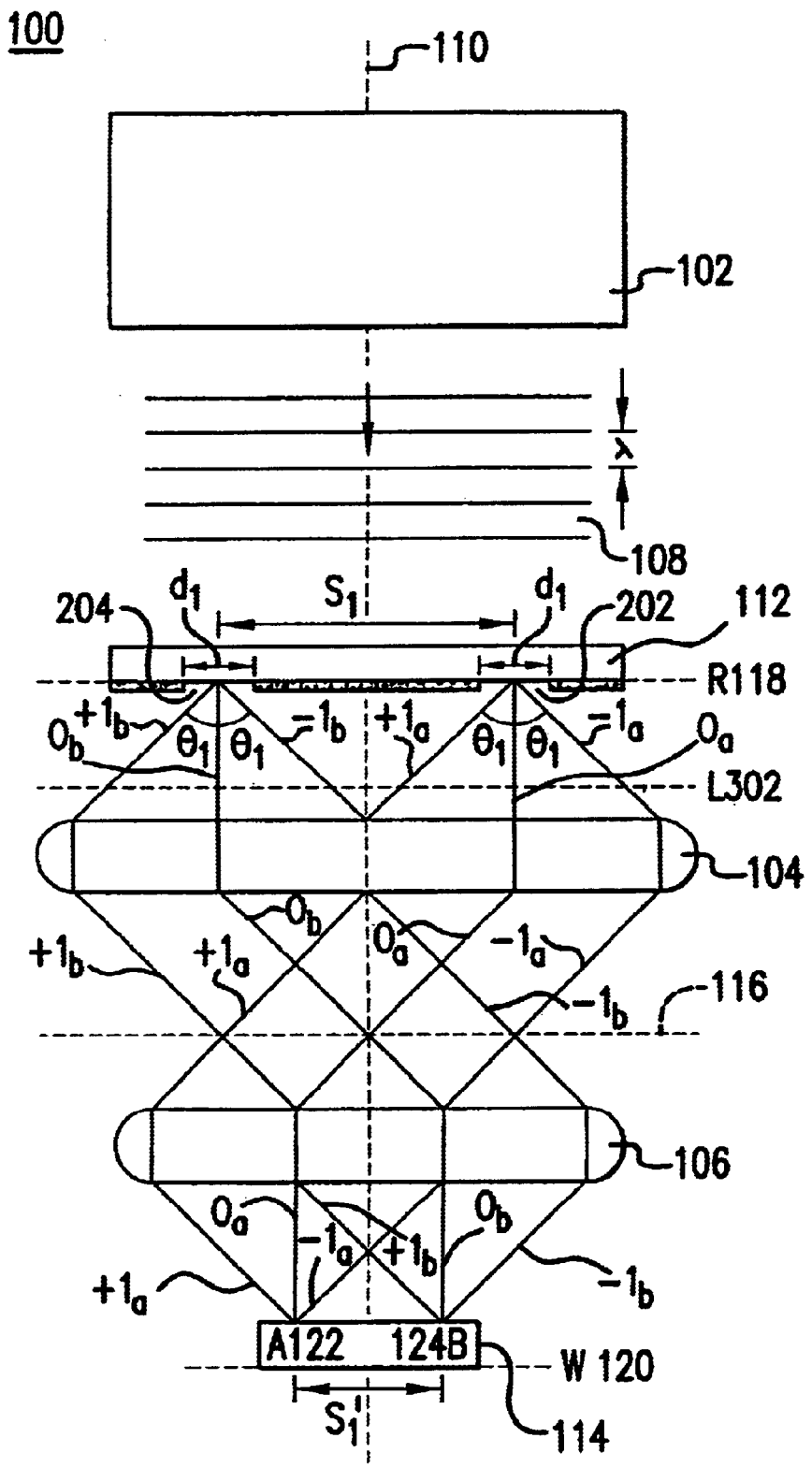
FIG. 1 is a block diagram illustration of an exemplary photolithographic system 100.

FIG. 1 is a block diagram illustration of an exemplary photolithographic system 100. Photolithographic system 100 comprises an illumination source 102, a first conditioning lens 104, and a second conditioning lens 106. Illumination source 102 produces light 108 which is directed along an optical axis 110. A portion of light 108 passes through a reticle 112 so that it replicates a pattern to be transferred into a layer of photoresist applied to a wafer 114. First and second conditioning lenses 104 and 106 are used to focus the portions of light 108 to the size of the features included in the IC. Often, photolithographic system 100 includes a pupil plane 116 through which all of the portions of light 108 pass. Pupil plane 116 provides the user with a convenient location to adjust photolithographic system 100 in a manner that effects all of the portions of light 108.

Ironically, the challenge to increase the density of devices fabricated on an IC chip is frustrated by the same smaller feature sizes upon which a greater density depends. Smaller pattern dimensions on reticle 112, particularly for linewidths, cause greater diffraction of light 108 passing through the pattern. Diffraction refers to a property of waves that causes them to spread and bend as they pass through small openings or around barriers. Of particular concern is how diffraction effects the portion of light 108 between exiting reticle 112 at a plane "R" 118 and impinging wafer 114 at a plane "W" 120.

Figure 2A:
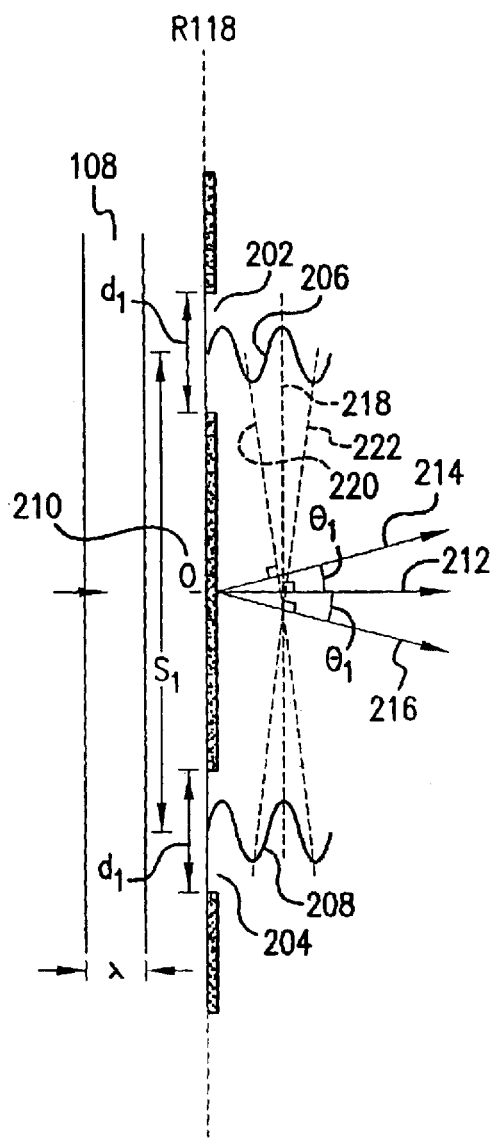
FIGS. 2A and 2B show how a diffraction pattern is a function of the interference of light 108 after it passes through a first transparent portion 202 and a second transparent portion 204 of plane R 118.
Figure 2B:
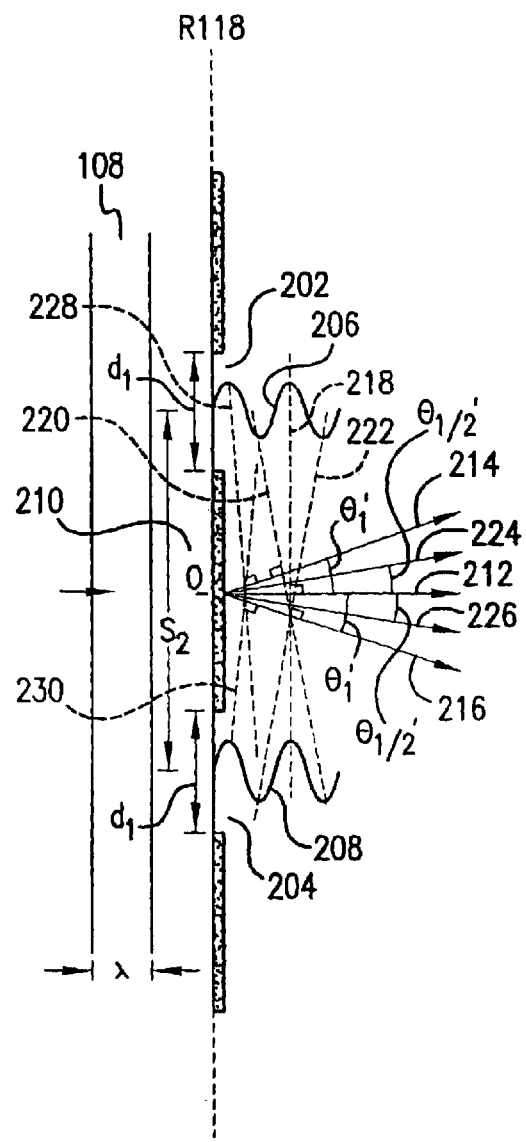

FIGS. 2A and 2B show how a diffraction pattern is a function of the interference of light 108 after it passes through a first transparent portion 202 and a second transparent portion 204 of plane R 118. Interference is a phenomenon that occurs when coherent beams of light overlap or intersect. Light consist of oscillating waves of electromagnetic energy. When beams of light overlap or intersect, the intensity of the light at the points of intersection is a function of the interaction among the waves of electromagnetic energies at those points. Where the intersecting beams have a high degree of coherence, the intensity of the light at the points of intersection is proportional to the square of the vector sum of the amplitudes of the waves of electromagnetic energies. If coherent beams are substantially in phase at the points of intersection, the intensity of the light is greater than the contribution of each individual beam. The points of intersection appear brighter than their surroundings. This is referred to as constructive interference. However, if coherent beams are significantly out of phase at the points of intersection, the intensity of the light is lesser than the contribution of each individual beam. The points of intersection appear dimmer than their surroundings. This is referred to as destructive interference.

In FIG. 2A, light 108 has a wavelength "$\lambda$". Each of first and second transparent portions 202 and 204 has a width "$d_1$". First and second transparent portions 202 and 204 are separated by a span "$s_1$". A first waveform 206 emerges from first transparent portion 202, while a second waveform 208 emerges from second transparent portion 204. Diffraction causes first and second waveforms 206 and 208 to spread as they propagate. As first and second waveforms 206 and 208 spread, they intersect.

From a point "O" 210 on plane R 118 at the midpoint of span $s_1$, three directions are shown: a first direction 212, a second direction 214, and a third direction 216. Along each of first, second, and third directions 212, 214, and 216, first and second waveforms 206 and 208 intersect such that their waveforms are in phase with one another. First direction 212 is perpendicular to plane R 118. As indicated by a first dashed line 218, first and second waveforms 206 and 208 are in phase with each other so that they constructively interfere along first direction 212. As indicated by a second dashed line 220, second waveform 208 leads first waveform 206 by wavelength $\lambda$. Here also first and second waveforms 206 and 208 are in phase with each other so that they constructively interfere along second direction 214, which is perpendicular to second dashed line 220. Similarly, as indicated by a third dashed line 222, first waveform 206 leads second waveform 208 by wavelength $\lambda$. Here again first and second waveforms 206 and 208 are in phase with each other so that they constructively interfere along third direction 216, which is perpendicular to third dashed line 222. In general, a direction of constructive interference can be determined as shown in Eq. (1):

$$(s)(\sin(\theta))=(m)(\lambda), \qquad \text{Eq. (1)}$$

where "$\theta$" is the angle formed at point O 210 between the direction of constructive interference and first direction 212, and m is an integer.

Each direction of constructive interference is referred to as an "order" of light, where m designates the numeric order. By convention, when viewed from the direction of propagation, the orders of light to the left of first direction 212 are negative orders, while the orders of light to the right of first direction 212 are positive orders. Thus, in FIG. 2A, first direction 212 is the "zero order" light, second direction 214 is the "negative first order" light, and third direction 216 is the "positive first order" light. Angle "$\theta_1$" for each of the negative and the positive first orders of light is determined from Eq. (1) when m=1. The directions of other orders of light can be similarly determined.

In FIG. 2B, first and second transparent portions 202 and 204 are separated by a span "$s_2$", where $s_2<s_1$. In comparison with FIG. 2A, FIG. 2B shows how the diffraction pattern changes with the span between first and second transparent portions 202 and 204. By application of Eq. (1), the negative and the positive first orders of light form an angle "$\theta_1$'" at point O 210 with the zero order light, where $\theta_1'>\theta_1$.

FIG. 2B also shows, from point O 210, a fourth direction 224 and a fifth direction 226. Along each of fourth and fifth directions 224 and 226, first and second waveforms 206 and 208 intersect such that their waveforms are out of phase with one another. As indicated by a fourth dashed line 228, second waveform 208 leads first waveform 206 by half of wavelength $\lambda$. Here first and second waveforms 206 and 208 are out of phase with each other so that they destructively interfere along fourth direction 224, which is perpendicular to fourth dashed line 228. Similarly, as indicated by a fifth dashed line 230, first waveform 206 leads second waveform 208 by half of wavelength $\lambda$. Here again first and second waveforms 206 and 208 are out of phase with each other so that they destructively interfere along fifth direction 226, which is perpendicular to fifth dashed line 230. Each direction of destructive interference is referred to as a "half order" of light. Thus, in FIG. 2B, fourth direction 224 is the "negative half order" light and fifth direction 226 is the "positive half order" light. Angle "$\theta_{1/2}$'" for each of the negative and the positive half orders of light is determined from Eq. (1) when m=½.

Returning to FIG. 1, the paths of the zero order, negative first order, and positive first order portions of light 108 that emerge from each of first and second transparent portions 202 and 204 are shown. To distinguish the portion of light 108 that emerges from first transparent portion 202 from the portion of light 108 that emerges from second transparent portion 204, subscripts are used. Thus, the zero order, the negative first order, and the positive first order portions of light 108 that emerge from first transparent portion 202 are labeled, respectively, "$-1_a$", "$0_a$", and "$+1_a$." Likewise, the zero order, the negative first order, and the positive first order portions of light 108 that emerge from second transparent portion 204 are labeled, respectively, "$-1_b$", "$0_b$", and "$+1_b$". First and second conditioning lenses 104 and 106 redirect these orders of light 108 to wafer 114. At wafer 114, the portion of light 108 from first transparent portion 202 impinges at a point "A" 122 and the portion of light 108 from second transparent portion 204 impinges at a point "B" 124. Points A 122 and B 124 are separated by a span "$s_1$'", where $s_1' < s_1$. In this manner, the pattern of reticle 112 is reduced to submicron dimensions and transferred to wafer 114.

Figure 3A:
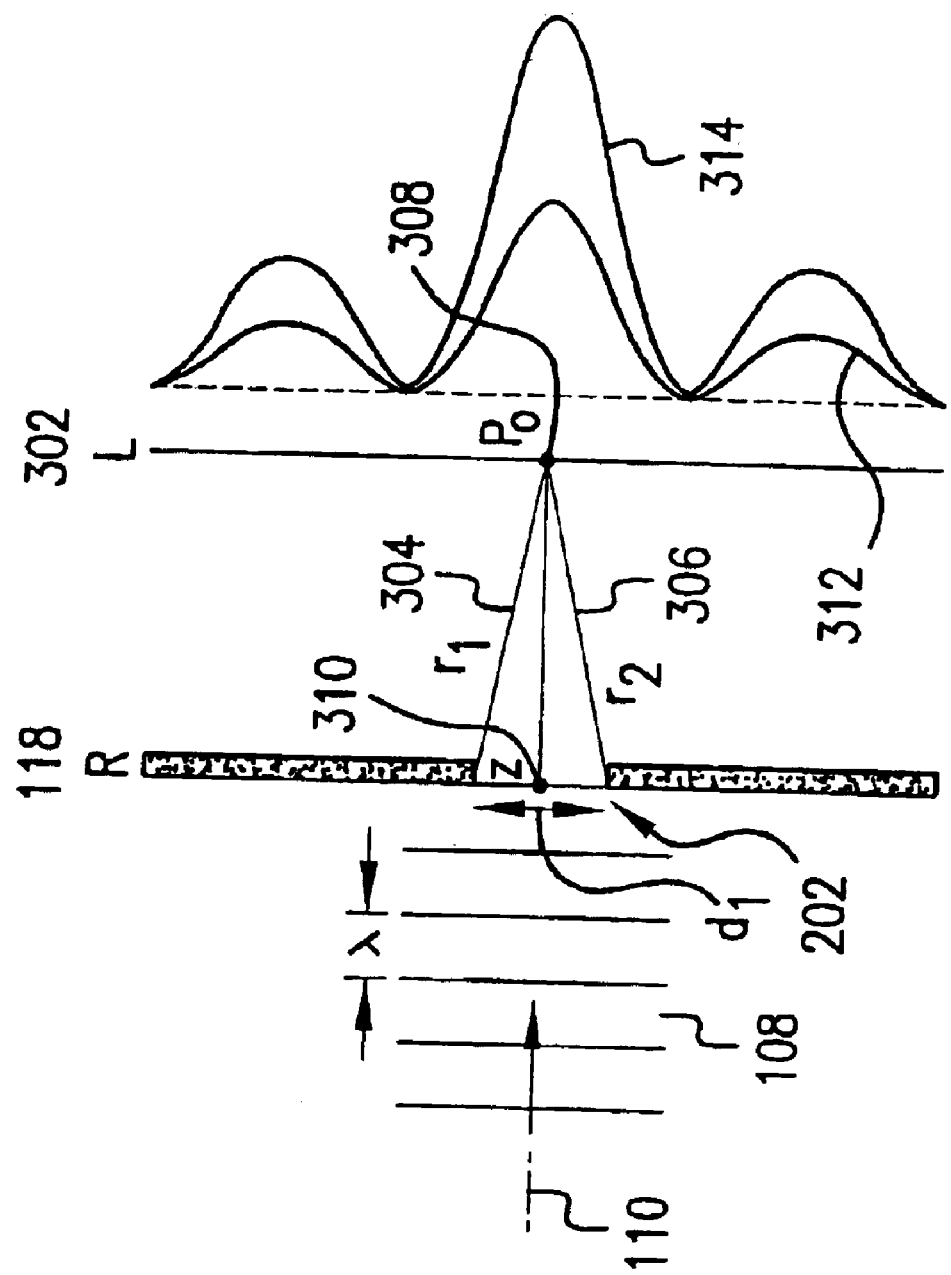
FIGS. 3A and 3B show the contribution of first transparent portion 202 with width $d_1$ to the diffraction pattern.
Figure 3B:
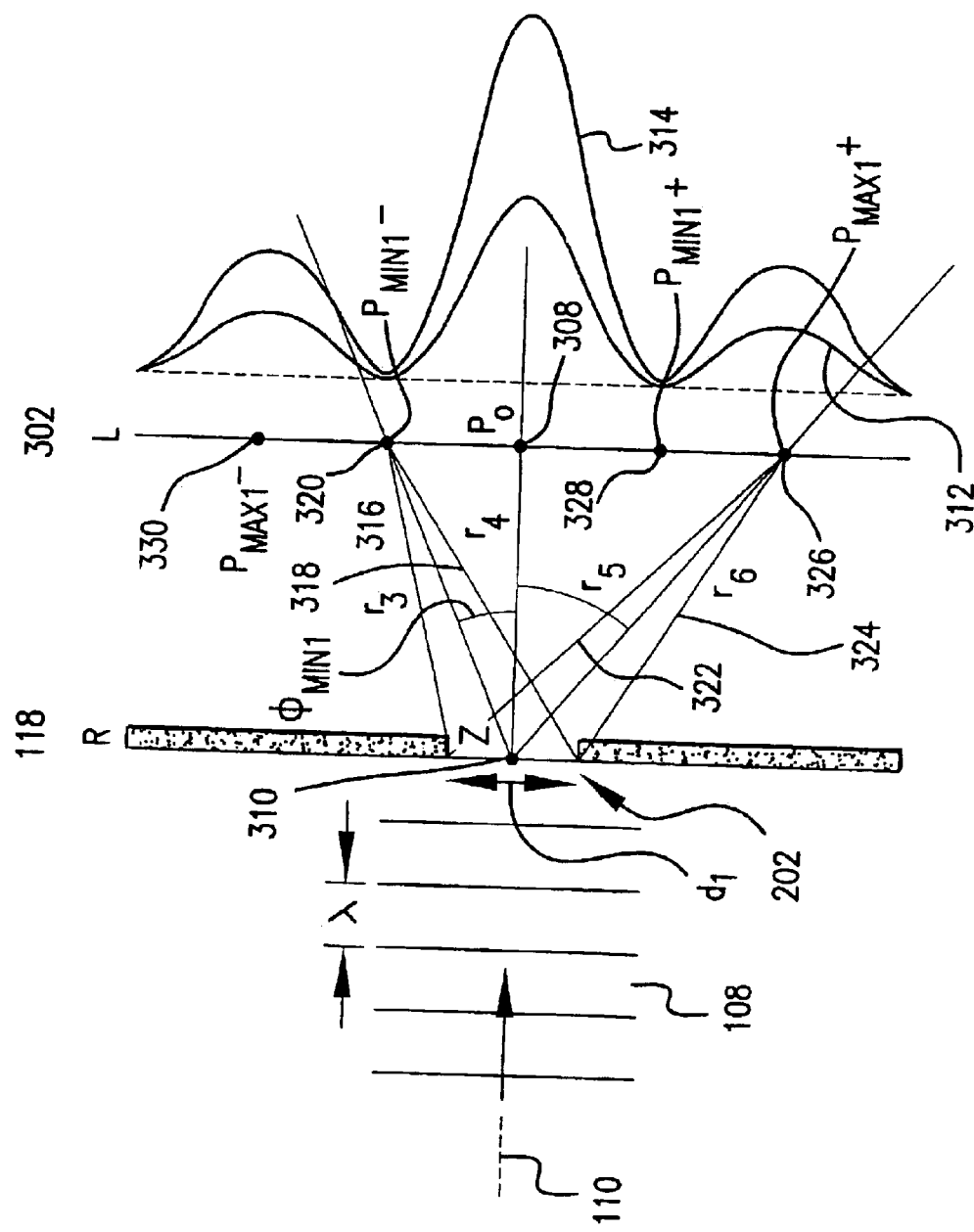

The diffraction pattern is also a function of the width "d" of each of the first and second transparent portions 202 and 204. FIGS. 3A and 3B show the contribution of first transparent portion 202 with width $d_1$ to the diffraction pattern. For illustrative purposes, the contribution of first transparent portion 202 to the diffraction pattern is shown at a plane "L" 302.

In FIG. 3A, a first ray "$r_1$" 304 exits plane R 118 from the top of first transparent portion 202, while a second ray "$r_2$" 306 exits plane R 118 from the bottom of first transparent portion 202. Both first ray $r_1$ 206 and second ray $r_2$ 208 impinge plane L 302 at a point "$P_0$" 308. Point $P_0$ 308 is directly opposite a point "Z" 310 at the center of first transparent portion 202. To reach point $P_0$ 308, first ray $r_1$ 304 and second ray $r_2$ 306 travel the same distance. The waves of first ray $r_1$ 304 and second ray $r_2$ 306 are in phase with one another and constructively interfere so that the vector sum of the amplitudes of their electromagnetic energies produce a maximum electromagnetic energy at point $P_0$ 308, as indicated on a graph 312. The intensity of the portion of light 108 is proportional to the square of the vector sum of the amplitudes of electromagnetic energies. Thus, point $P_0$ 308 is also a principal maximum intensity, as indicated on a graph 314.

In FIG. 3B, a third ray "$r_3$" 316 exits plane R 118 from the top of first transparent portion 202, while a fourth ray "$r_4$" 318 exits plane R 118 from the bottom of first transparent portion 202. Both third ray $r_3$ 316 and fourth ray $r_4$ 318 impinge plane L 302 at a point "$P_{min1}^-$" 320. To reach point $P_{min1}^-$ 320, third ray $r_3$ 316 and fourth ray $r_4$ 318 travel different distances. The difference in the distances traveled by third ray $r_3$ 316 and fourth ray $r_4$ 318 is an odd multiple of half of wavelength λ. The waves of third ray $r_3$ 316 and fourth ray $r_4$ 318 are out of phase with one another and destructively interfere so that the vector sum of the amplitudes of their electromagnetic energies combine to produce a minimum electromagnetic energy at point $P_{min1}^-$ 320, as indicated on graph 312. Point $P_{min}^-$ 320 is also a minimum intensity, as indicated on graph 314.

Also in FIG. 3B, a fifth ray "$r_5$" 322 exits plane R 118 from the top of first transparent portion 202, while a sixth ray "$r_6$" 324 exits plane R 118 from the bottom of first transparent portion 202. Both fifth ray $r_5$ 322 and sixth ray $r_6$ 324 impinge plane L 302 at a point "$P_{LMAX1}^+$" 326. To reach point $P_{LMAX1}^+$ 326, fifth ray $r_5$ 322 and sixth ray $r_6$ 324 travel different distances. The difference in the distances traveled by fifth ray $r_5$ 322 and sixth ray $r_6$ 324 is an even multiple of half of wavelength λ. The waves of fifth ray $r_5$ 322 and sixth ray $r_6$ 324 are in phase with one another and constructively interfere so that the vector sum of the amplitudes of their electromagnetic energies combine to produce a local maximum energy at point $P_{LMAX1}^+$ 326, as indicated on graph 312. Point $P_{LMAX1}^+$ 326 is also a local maximum intensity, as indicated on graph 314.

The pattern of intensity shown on graph 314 is symmetric about its point of principal maximum intensity at point $P_0$ 308. Thus, there is a point "$P_{min1}^+$" 328 that corresponds symmetrically to point $P_{min1}^-$ 320, and a point "$P_{LMAX1}^-$" 330 that corresponds symmetrically to point $P_{LMAX1}^+$ 326. In general, a point of minimum intensity can be determined as shown in Eq. (2):

$$(d)(\sin((\phi)) = (n)(\lambda), \qquad \text{Eq. (2)}$$

where "ϕ" is the angle formed at point Z 310 between the direction of the point of minimum intensity and point $P_0$ 308, and n is a non-zero integer. For example, point $P_{min1}^-$ 320 is at an angle "$\phi_{min1}$."

Figure 4:
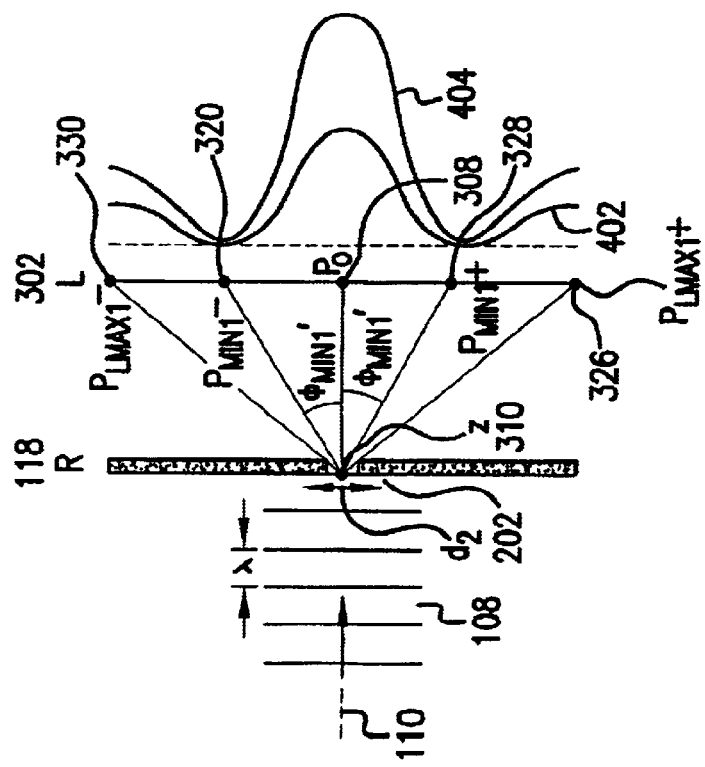
FIG. 4 shows the contribution of first transparent portion 202 with a width "$d_2$" to the diffraction pattern, where $d_2 < d_1$.

FIG. 4 shows the contribution of first transparent portion 202 with a width "$d_2$" to the diffraction pattern, where $d_2 < d_1$. In comparison with FIGS. 3A and 3B, FIG. 4 shows how the diffraction pattern changes with the width of first transparent portion 202. By application of Eq. (2), the first negative and the first positive points of minima intensities form an angle "$\phi_{min1}'$" at point Z 310 between the direction of the point of minimum intensity and point $P_0$ 308, where $\phi_{min1}' > \phi_{min1}$. Thus, here the distribution of the electromagnetic energy of the portion of light 108 from first transparent portion 202 is shown as a graph 402, and the distribution of the intensity of the portion of light 108 from first transparent portion 202 is shown as a graph 404. Note that the peaks on graphs 312 and 314 are sharper than the peaks on graphs 402 and 404.

Figure 5A:
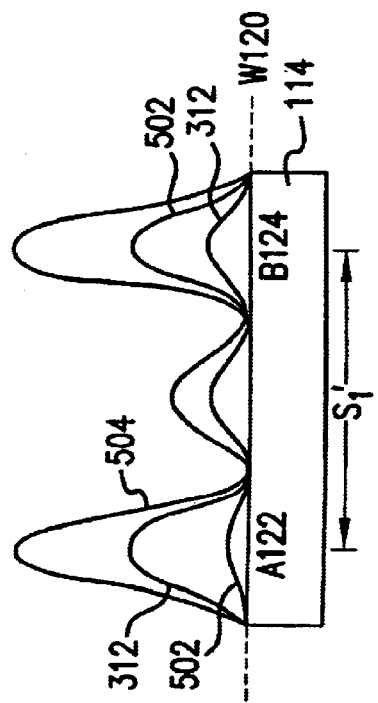
FIGS. 5A and 5B show the diffraction patterns at points A 122 and B 124 at plane W 120 on wafer 114.
Figure 5B:
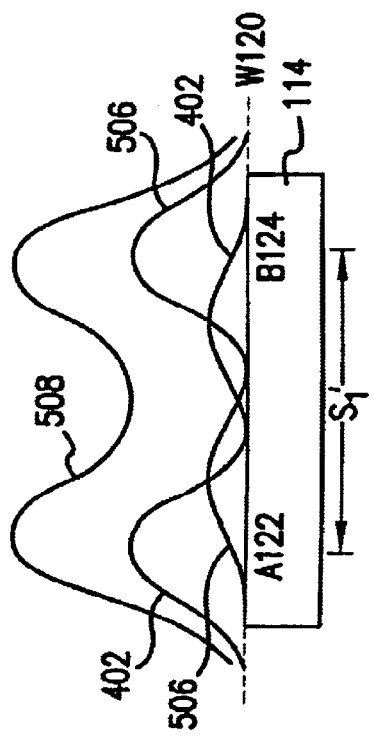

FIGS. 5A and 5B show the diffraction patterns at points A 122 and B 124 at plane W 120 on wafer 114. As mentioned above, first and second conditioning lenses 104 and 106 redirect the portions of light 108 to wafer 114. At wafer 114, the portion of light 108 from first transparent portion 202 impinges at point A 122 and the portion of light 108 from second transparent portion 204 impinges at point B 124.

FIG. 5A shows the diffraction pattern when first and second transparent portions 202 and 204 each have width $d_1$ and are separated by span $s_1$. The distribution of the electromagnetic energy of the portion of light 108 from first transparent portion 202 is shown as graph 312 from FIGS. 3A and 3B. The point of maximum electromagnetic energy is shown opposite point A 122. Similarly, the distribution of the electromagnetic energy of the portion of light 108 from second transparent portion 204 is shown as a graph 502. The point of maximum electromagnetic energy is shown opposite point B 124. Graphs 312 and 502 have the same shape, but are offset by span $s_1$'. The intensity of the portion of light 108 is proportional to the square of the vector sum of the amplitudes of electromagnetic energies. Thus, the distribution of the intensity of the portion of light 108 at wafer 114 is shown as a graph 504, which is the square of the vector sum of the amplitudes of electromagnetic energies shown in graphs 312 and 502.

FIG. 5B shows the diffraction pattern when first and second transparent portions 202 and 204 each have width $d_2$ and are separated by span $s_1$. The distribution of the electromagnetic energy of the portion of light 108 from first transparent portion 202 is shown as graph 402 from FIG. 4. Again, the point of maximum electromagnetic energy is shown opposite point A 122. Similarly, the distribution of the electromagnetic energy of the portion of light 108 from second transparent portion 204 is shown as a graph 502. The point of maximum electromagnetic energy is shown opposite point B 124. Again, graphs 402 and 506 have the same shape, but are offset by span $s_1'$. The distribution of the intensity of the portion of light 108 at wafer 114 is shown as a graph 508, which is the square of the vector sum of the amplitudes of electromagnetic energies shown in graphs 402 and 506.

A comparison between graphs 504 and 508 shows that the peaks on graph 504 are sharper than the peaks on graph 508. Also, in graph 504, the peak that corresponds to the portion of light 108 from first transparent portion 202 is more readily discernible from the peak that corresponds to the portion of light 108 from second transparent portion 204. In contrast, in graph 508, the two peaks tend to merge together in a manner that makes distinguishing one from the other more difficult. This situation is referred to as "spillover". Spillover degrades the degree of resolution that can be obtained between features in the pattern of reticle 112 when they are reduced and transferred to wafer 114. Furthermore, an examination of the preceding figures shows that more spillover occurs if span s is reduced from, for example, span $s_1$ to span $s_2$. Thus, the preceding figures show how the challenge to increase the density of devices fabricated on an IC chip is frustrated by the same smaller feature sizes upon which a greater density depends.

Figure 6:
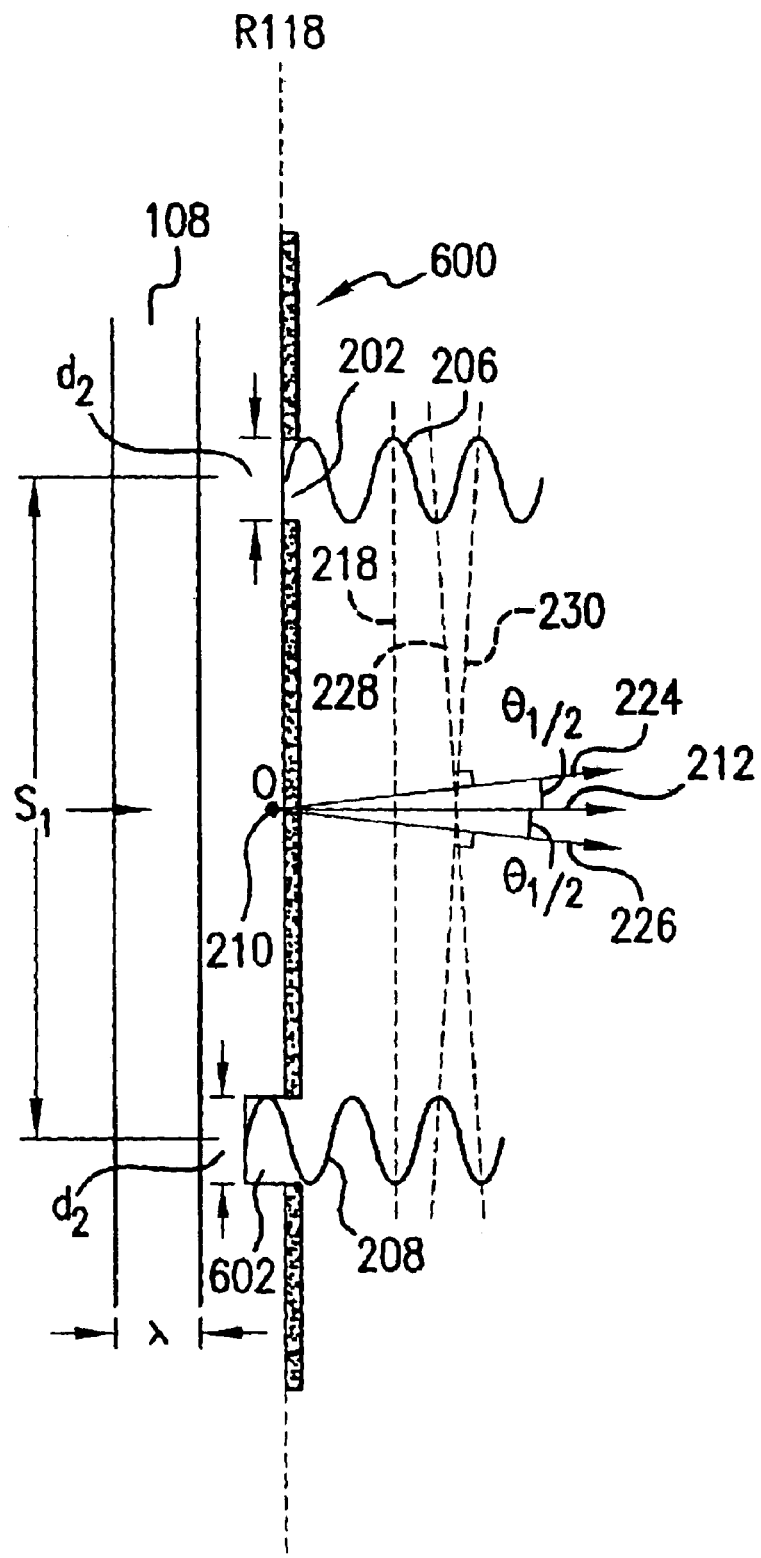
FIG. 6 shows how the diffraction pattern changes when reticle 112 is realized as an alternating phase shift mask 600.

One way to diminish spillover is to reduce the vector sum of the amplitudes of electromagnetic energies of adjacent features in the pattern of reticle 112 by use of an alternating phase shift mask. FIG. 6 shows how the diffraction pattern changes when reticle 112 is realized as an alternating phase shift mask 600. In FIG. 6, light 108 has wavelength λ. Alternating phase shift mask 600 includes first transparent portion 202 and a phase shift transparent portion 602. Each of first transparent portion 202 and phase shift transparent portion 602 has width $d_2$. First transparent portion 202 and phase shift transparent portion 602 are separated by span $s_1$. Phase shift transparent portion 602 is further characterized by a recess formed in plane R 118. The recess extends into plane R 118 by an odd multiple of one half of wavelength λ. (Alternatively, phase shift transparent portion 602 can be further characterized by a transparent rise formed on plane 118, wherein the rise extends out of plane R 118 by an odd multiple of one half of wavelength λ.)

In FIG. 6, first waveform 206 emerges from first transparent portion 202, while a second waveform 208 emerges from phase shift transparent portion 602. From point O 210 on plane R 118 at the midpoint of span $s_1$, three directions are shown: first direction 212, fourth direction 224, and fifth direction 226. First direction 212 is perpendicular to plane R 118. As indicated by first dashed line 218, second waveform 208 leads first waveform 206 by half of wavelength λ. Here first and second waveforms 206 and 208 are out of phase with each other so that they destructively interfere along first direction 212. As indicated by fourth dashed line 228, first and second waveforms 206 and 208 are in phase with each other so that they constructively interfere along fourth direction 224, which is perpendicular to fourth dashed line 228. As indicated by fifth dashed line 230, first and second waveforms 206 and 208 are in phase with each other so that they constructively interfere along fifth direction 226, which is perpendicular to fifth dashed line 230. An angle "$\theta_{1/2}$" formed at point O 210 for each of the negative and the positive half orders of light is determined from Eq. (1) when m=½.

A comparison between FIG. 6 and FIGS. 2A and 2B shows that the diffraction pattern in FIG. 6 is the reverse of the diffraction pattern in FIGS. 2A and 2B. In FIG. 2B, the zero order light (first direction 212) is a direction of constructive interference and the negative half order light (fourth direction 224) and the positive half order light (fifth direction 226) are directions of destructive interference. In contrast, in FIG. 6, the zero order light (first direction 212) is a direction of destructive interference (as are the negative first order light and the positive first order light, which are not shown) and the negative half order light (fourth direction 224) and the positive half order light (fifth direction 226) are directions of constructive interference.

Figure 7:
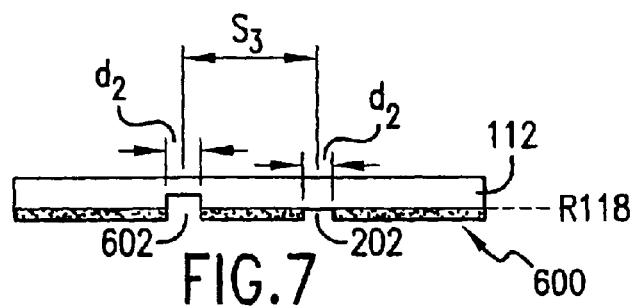
FIG. 7 shows reticle 112 realized as alternating phase shift mask 600.

Furthermore, taken as a whole, the teachings of FIGS. 1, 2A and 2B, and 6 show a first advantage of alternating phase shift mask 600. FIG. 1 shows that the first order lights (i.e., $-1_a$, $+1_a$, $-1_b$, and $+1_b$) from first and second transparent portions 202 and 204 each exit reticle 112 at angle $\theta_1$. The first order lights are directions of constructive interference. FIG. 6 shows that by using alternating phase shift mask 600, the first order lights become directions of destructive interference, while the half order lights become directions of constructive interference. In FIG. 6, the half order lights each have angle $\theta_{1/2}'$, which is half of angle $\theta_1'$ for each of the corresponding first order lights. FIGS. 2A and 2B show that as span s is decreased from, for example span $s_1$ to span $s_2$, angle θ increases from angle $\theta_1$ to angle $\theta_1'$. Thus, in FIG. 1, if reticle 112 is realized as alternating phase shift mask 600, span s can be reduced so that angle θ increases. So long as the half order lights impinge first conditioning lens 104, angle θ can be increased. Because the zero order and first order lights are now directions of destructive interference, it does not matter that the increase in angle θ may preclude some of the first order lights (i.e., $-1_a$ and $+1_b$) from impinging upon first conditioning lens 104. When reticle 112 is realized as alternating phase shift mask 600, the half order lights, which are the directions of constructive interference, are used to transfer the pattern of reticle 112 to wafer 114. Such a configuration of reticle 112 realized as alternating phase shift mask 600 is shown in FIG. 7. In FIG. 7, first transparent portion 202 and phase shift transparent portion 602 are separated by a span "$s_3$", where $s_3<s_1$.

Figure 8:
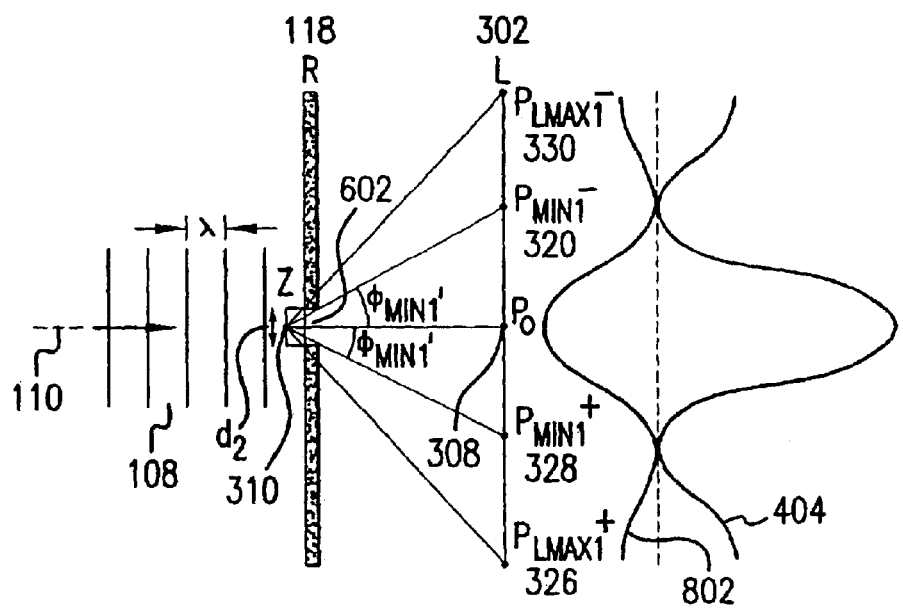
FIG. 8 shows the contribution of phase shift transparent portion 602 with width $d_2$ to the diffraction pattern.

FIG. 8 shows the contribution of phase shift transparent portion 602 with width $d_2$ to the diffraction pattern. In FIG. 8, the distribution of the electromagnetic energy of the portion of light 108 from phase shift transparent portion 602 is shown as a graph 802. Graph 802 is a mirror image of graph 402 in FIG. 4. However, because the intensity of the portion of light 108 is proportional to the square of the vector sum of the amplitudes of electromagnetic energies, the distribution of the intensity of the portion of light 108 from phase shift transparent portion 602 is identical to graph 404 in FIG. 4.

Figure 9:
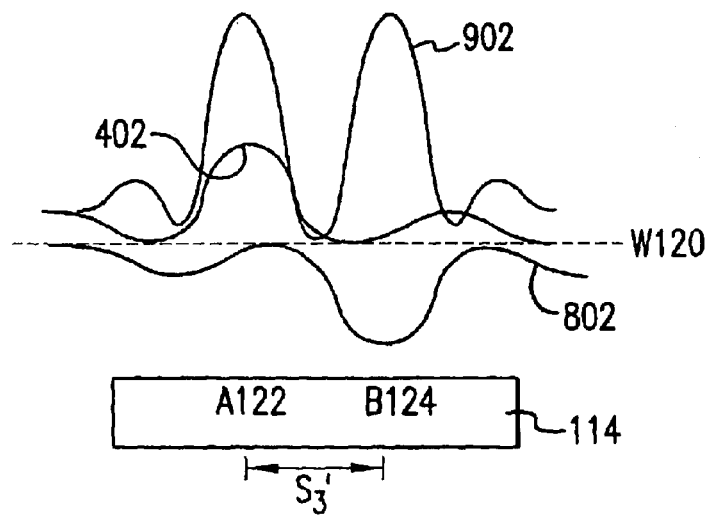
FIG. 9 shows the diffraction patterns at points A 122 and B 124 at plane W 120 on wafer 114 when first transparent portion 202 and phase shift transparent portion 602 each have width $d_2$ and are separated by span $s_3$.

FIG. 9 shows the diffraction patterns at points A 122 and B 124 at plane W 120 on wafer 114 when first transparent portion 202 and phase shift transparent portion 602 each have width $d_2$ and are separated by span $s_3$. The distribution of the electromagnetic energy of the portion of light 108 from first transparent portion 202 is shown as graph 402 from FIG. 4. The point of maximum electromagnetic energy is shown opposite point A 122. Similarly, the distribution of the electromagnetic energy of the portion of light 108 from phase shift transparent portion 602 is shown as graph 802. The point of maximum electromagnetic energy is shown opposite point B 124. Graphs 402 and 802 have mirror image shapes and are offset by a span "$s_3'$", which corresponds to the reduction in span $s_3$ produced by first and second conditioning lenses 104 and 106. The intensity of the portion of light 108 is proportional to the square of the vector sum of the amplitudes of electromagnetic energies. Thus, the distribution of the intensity of the portion of light 108 at wafer 114 is shown as a graph 902, which is the square of the vector sum of the amplitudes of electromagnetic energies shown in graphs 402 and 802.

A comparison between graphs 902 (of FIG. 9) and 508 (of FIG. 5B) shows that the peaks on graph 902 are sharper than the peaks on graph 508. Also, in graph 902, the peak that corresponds to the portion of light 108 from first transparent portion 202 is more readily discernible from the peak that corresponds to the portion of light 108 from phase shift transparent portion 602. In contrast, in graph 508, the two peaks from first and second transparent portions 202 and 204 tend to merge together in a manner that makes distinguishing one from the other more difficult. Furthermore, the peaks on graph 902 are separated by span $s_3'$, which is shorter than span $s_1'$, the separation of the peaks on graph 508. Thus, graph 902 shows a greater degree of resolution than that shown by graph 508. This greater degree of resolution is a second advantage of alternating phase shift mask 600.

Although, in theory, alternating phase shift mask 600 offers much promise for increasing the density of devices fabricated on an IC chip, limitations in manufacturing abilities can diminish the efficacy of this approach. Realizing a viable alternating phase shift mask 600 depends upon an ability to precisely fabricate phase shift transparent portions 602 having recesses (or rises) in (on) reticle 112 with a depth (height) of an odd multiple of one half wavelength λ and a width d, and that are spaced from adjacent transparent portions 202 by a span s.

Recalling the explanation above with respect to FIG. 6, if there are deviations from these criteria, first and second waveforms 206 and 208 may not be completely out of phase (e.g., second waveform 208 may lead first waveform 206 by not exactly half of wavelength λ). Hence, the destructive interference of the zero order light (e.g., first direction 212) in alternating phase shift mask 600 may not be complete. In this case, the zero order light may have an intensity that is not insignificant. Such undesired intensity in the zero order light is referred to as "zero order leakage".

Figure 10:
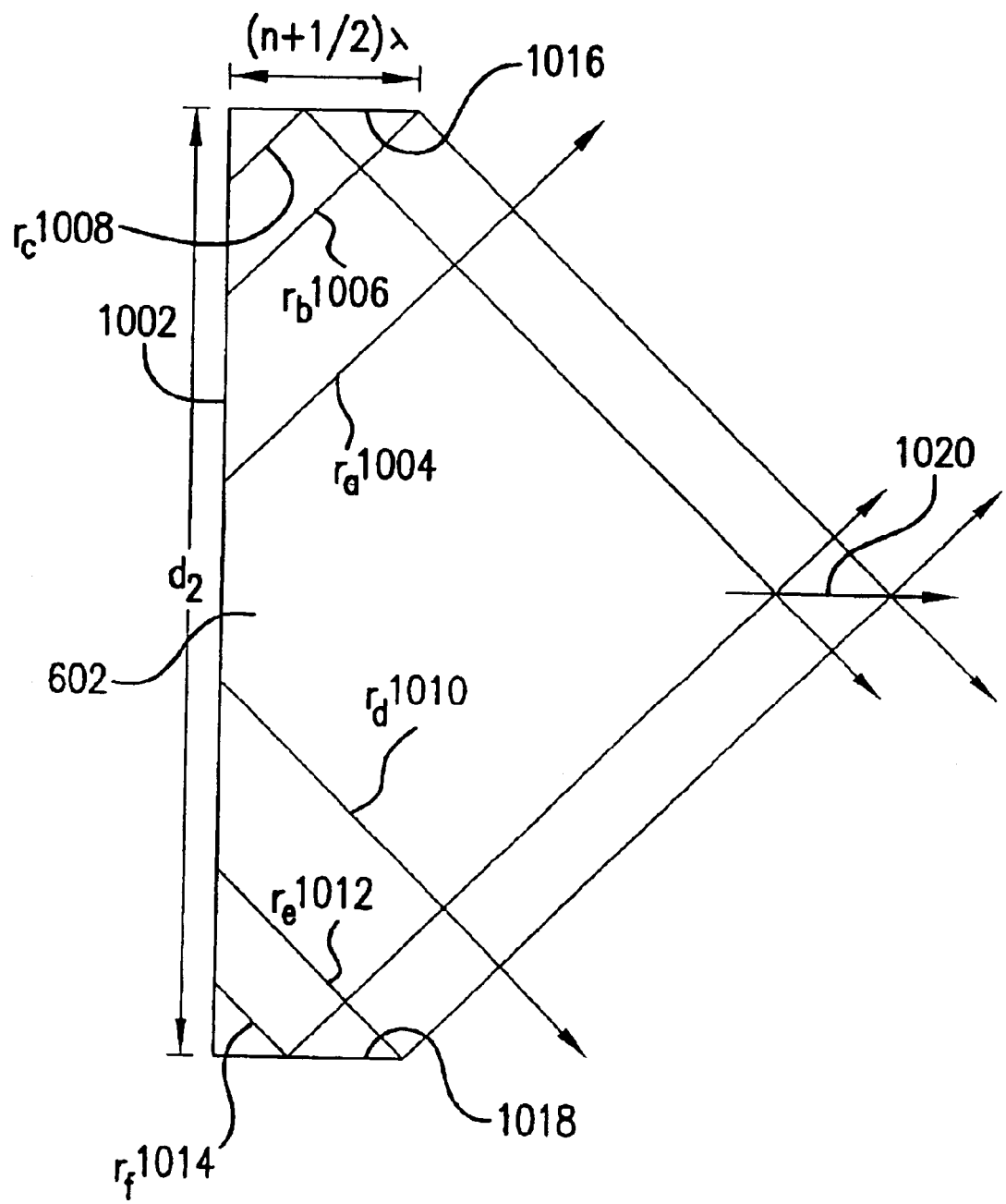
FIG. 10 shows the topographic effect produced as a portion of light 108 emerges from phase shift transparent portion 602.

Furthermore, even if alternating phase shift mask 600 is perfectly manufactured, the resulting topography gives rise to additional modes of diffraction that can cause the zero order light to have an intensity that is not insignificant. This phenomenon is referred to as the "topographic effect" or the "transmission line effect". Thus, a certain amount of zero order leakage is inherently incumbent to using alternating phase shift mask 600. FIG. 10 shows the topographic effect produced as a portion of light 108 emerges from phase shift transparent portion 602.

In FIG. 10, six rays are shown emerging from a back wall 1002 of phase shift transparent portion 602: a first ray "$r_a$" 1004, a second ray "$r_b$" 1006, a third ray "$r_c$" 1008, a fourth ray "$r_d$" 1010, a fifth ray "$r_e$" 1012, and a sixth ray "$r_f$" 1014. First, second, and third rays $r_a$ 1004, $r_b$ 1006, and $r_c$ 1008 diffract in the negative direction, while fourth, fifth, and sixth rays $r_d$ 1010, $r_e$ 1012, and $r_f$ 1014 diffract in the positive direction. First and fourth rays $r_a$ 1004 and $r_d$ 1010 propagate from phase shift transparent portion 602 in the same manner as shown in FIG. 8. In contrast, second and third rays $r_b$ 1006 and $r_c$ 1008 impinge a negative side wall 1016 and are redirected in the positive direction. Similarly, fifth and sixth rays $r_e$ 1012 and $r_f$ 1014 impinge a positive side wall 1018 and are redirected in the negative direction. Second and fifth rays $r_b$ 1006 and $r_e$ 1012 constructively interfere at their point of intersection. Likewise, third and sixth rays $r_c$ 1008 and $r_f$ 1014 constructively interfere at their point of intersection. The net result of the redirections of second, third, fifth, and sixth rays $r_b$ 1006, $r_c$ 1008, $r_e$ 1012, and $r_f$ 1014 is that light with an intensity that may not be insignificant propagates in the zero order direction as shown by an arrow 1020. This is the topographic effect.

Figure 11:
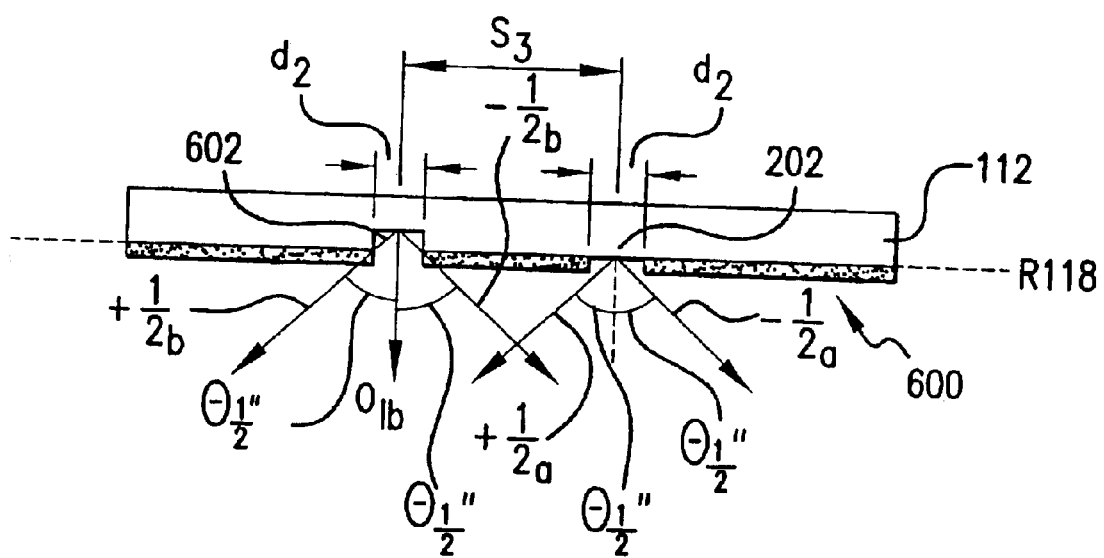
FIG. 11 shows the paths of the negative half order, positive half order, and zero order leakage lights from reticle 112 realized as alternating phase shift mask 600.

FIG. 11 shows the paths of the negative half order, the positive half order, and the zero order leakage lights from reticle 112 realized as alternating phase shift mask 600. In FIG. 11, first transparent portion 202 and phase shift transparent portion 602 each have width $d_2$ and are separated by span $s_3$. To distinguish the portion of light 108 that emerges from first transparent portion 202 from the portion of light 108 that emerges from phase shift transparent portion 602, subscripts are used. Thus, the negative half order and the positive half order portions of light 108 that emerge from first transparent portion 202 are labeled, respectively, "$-\frac{1}{2}_a$" and "$+\frac{1}{2}_a$". Each of negative half order light $-\frac{1}{2}_a$ and positive half order light $+\frac{1}{2}_a$ emerges from first transparent portion 202 at an angle "½'". Likewise, the negative half order, the positive half order, and the zero order leakage portions of light 108 that emerge from phase shift transparent portion 602 are labeled, respectively, "$-\frac{1}{2}_b$", "$+\frac{1}{2}_b$", and "$0_{1b}$". Each of negative half order light $-\frac{1}{2}_b$ and positive half order light $+\frac{1}{2}_b$ emerges from phase shift transparent portion 602 at angle $\theta_{1/2}''$.

Although explanations heretofore have been with regards to portions of light 108 impinging wafer 114 at plane W 120, the skilled artisan will appreciate that, with wavelength λ measuring on an order of hundreds of nanometers, variations in the thickness of the layer of photoresist applied to wafer 114 can be significantly large enough to invalidate modeling the layer of photoresist as a single plane. Viable photolithographic systems must be able to reduce the pattern of reticle 112 and transfer the pattern to wafer 114 even when the layer photoresist deviates substantially from plane W 120.

Figure 12:
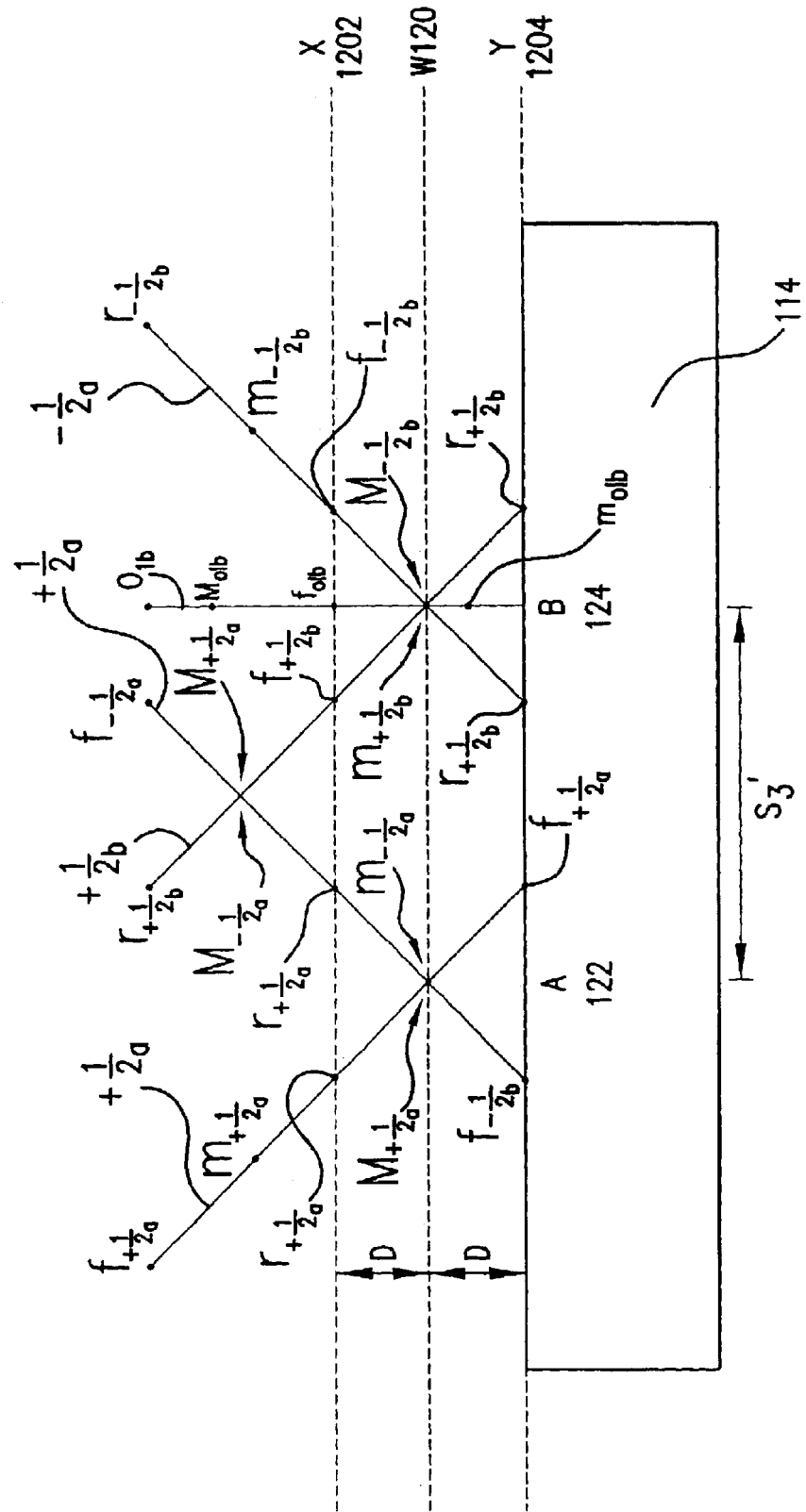
FIG. 12 shows the paths of the negative half order, the positive half order, and the zero order leakage lights that impinge upon wafer 114 at different planes.

FIG. 12 shows the paths of the negative half order, the positive half order, and the zero order leakage lights that impinge upon wafer 114 at different planes. In FIG. 12, plane W 120 is shown as the nominal plane of focus. A plane "X" 1202 is shown parallel to plane W 120, but a distance "D" closer to illumination source 102. Similarly, a plane "Y" 1204 is shown parallel to plane W 120, but a distance D further from illumination source 102.

Along each of the negative half order light $-\frac{1}{2}_a$, the positive half order light $+\frac{1}{2}_a$, the negative half order light $-\frac{1}{2}_b$, the positive half order light $+\frac{1}{2}_b$, and the zero order leakage light $0_{1b}$ are shown points that represent the phase in the period of wavelength λ of the portion of light 108. These points are labeled: "f" (falling from zero), "m" (minimum), "r" (rising from zero), and "M" (maximum). Wavelength λ corresponds to the distance between two common phase points on one of the order portions of light 108 (i.e., f to f).

To distinguish the portion of light 108 that emerges from first transparent portion 202 from the portion of light 108 that emerges from phase shift transparent portion 602, subscripts are used. Thus, for the positive half order light $+\frac{1}{2}_a$, wavelength λ tracks from "$f_{+1/2a}$" to "$m_{+1/2a}$" to "$r_{+1/2a}$" to "$M_{+1/2a}$" to $f_{+1/2a}$. Likewise, for the negative half order portion light $-\frac{1}{2}_a$, wavelength λ tracks from "$f_{-1/2a}$" to "$m_{-1/2a}$" to "$r_{-1/2a}$" to "$M_{-1/2a}$" to $f_{-1/2a}$. Similarly, for the positive half order light $+\frac{1}{2}_b$, wavelength λ tracks from "$f_{+1/2b}$" to "$m_{+1/2b}$" to "$r_{+1/2b}$" to "$M_{+1/2b}$" to $f_{+1/2b}$. Also, for the negative half order light $-\frac{1}{2}_b$, wavelength λ tracks from "$f_{-1/2b}$" to "$m_{-1/2b}$" to "$r_{-1/2b}$" to "$M_{-1/2b}$" to $f_{-1/2b}$. Finally, for the zero order leakage light $0_{1b}$, wavelength λ tracks from "$r_{01b}$" (not shown) to "$M_{01b}$" to "$f_{01b}$" to "$m_{01b}$" to $r_{01b}$ (not shown).

An examination of FIG. 12 shows that the negative and the positive half order lights $-\frac{1}{2}_a$ and $+\frac{1}{2}_a$ are in phase with each other, and that the negative and the positive half order lights $-\frac{1}{2}_b$ and $+\frac{1}{2}_b$ are also in phase with each other. Collectively, the negative and the positive half order lights $-\frac{1}{2}_a$ and $+\frac{1}{2}_a$ that emerge from first transparent portion 202 and the negative and the positive half order lights $-\frac{1}{2}_b$ and $+\frac{1}{2}_b$ that emerge from phase shift transparent portion 602 are out of phase with each other. This is in keeping with the shapes of graphs 402 and 802 of FIG. 9.

However, a comparison of the zero order leakage light $0_{1b}$ with the negative and the positive half order lights $-\frac{1}{2}_b$ and $+\frac{1}{2}_b$ that emerge from phase shift transparent portion 602 shows that these three portions of light are substantially in phase with one another at plane X 1202, but that the zero order leakage light $0_{1b}$ is substantially out of phase with the negative and the positive half order lights $-\frac{1}{2}_b$ and $+\frac{1}{2}_b$ at plane Y 1204.

Figure 13A:
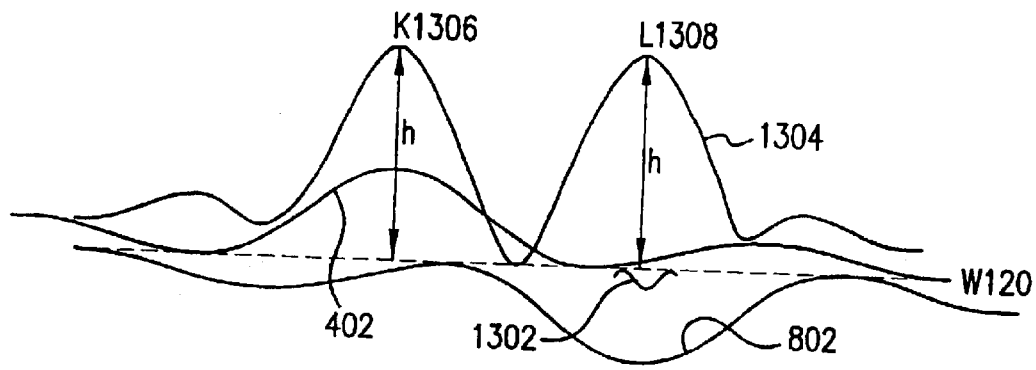
FIGS. 13A, 13B, and 13C show the diffraction patterns caused when the paths of the negative half order, the positive half order, and the zero order leakage lights impinge upon wafer 114 at different planes.
Figure 13B:
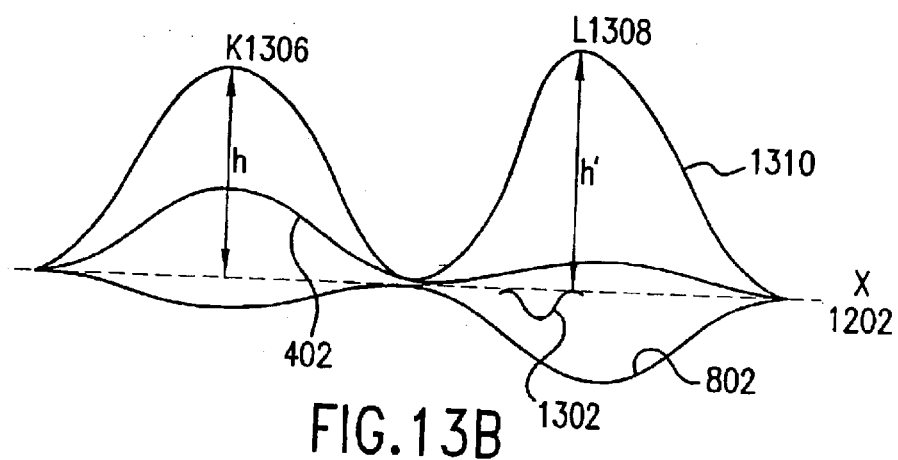
Figure 13C:
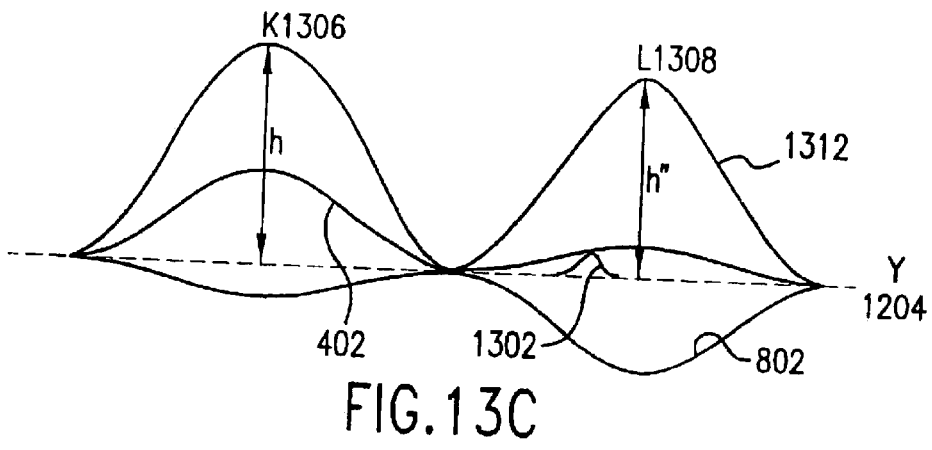

FIGS. 13A, 13B, and 13C show the diffraction patterns caused when the paths of the negative half order, the positive half order, and the zero order leakage lights impinge upon wafer 114 at different planes.

FIG. 13A shows the contribution of the zero order leakage light $0_{1b}$ that emerges from phase shift transparent portion 602 to the diffraction pattern at plane W 120. The distribution of the electromagnetic energy of the half order portions of light $-\frac{1}{2}_a$ and $+\frac{1}{2}_a$ from first transparent portion 202 is shown as graph 402 from FIG. 4. Similarly, the distribution of the electromagnetic energy of the half order portions of light $-\frac{1}{2}_b$ and $+\frac{1}{2}_b$ from phase shift transparent portion 602 is shown as graph 802 from FIG. 8. Furthermore, the distribution of the electromagnetic energy of the zero order leakage light $0_{1b}$ from phase shift transparent portion 602 is shown as a graph 1302. The intensity of the portion of light 108 is proportional to the square of the vector sum of the amplitudes of electromagnetic energies. Thus, the distribution of the intensity of the portion of light 108 at plane W 120 is shown as a graph 1304, which is the square of the vector sum of the amplitudes of electromagnetic energies shown in graphs 402, 802, and 1302.

Because the distribution of the electromagnetic energy shown in graph 802 is produced when the negative and the positive half order lights $-\frac{1}{2}_b$ and $+\frac{1}{2}_b$ are in close proximity to each other (see FIG. 12), the distribution of the electromagnetic energy shown in graph 1302 has little impact on the distribution of the intensity of the portion of light 108 at plane W 120 as shown at graph 1304. A comparison between graphs 1304 (of FIG. 13A) and 902 (of FIG. 9) shows that both graphs have similar shapes characterized by two peaks: peak "K" 1306 and "L" 1308. Each peak has a height "h".

FIG. 13B shows the contribution of the zero order leakage light $0_{1b}$ that emerges from phase shift transparent portion 602 to the diffraction pattern at plane X 1202. As in FIG. 13A, the distribution of the electromagnetic energy of the half order portions of light $-\frac{1}{2}_a$ and $+\frac{1}{2}_a$ from first transparent portion 202 is shown as graph 402 from FIG. 4; the distribution of the electromagnetic energy of the half order portions of light $-\frac{1}{2}_b$ and $+\frac{1}{2}_b$ from phase shift transparent portion 602 is shown as graph 802 from FIG. 8; and the distribution of the electromagnetic energy of the zero order leakage light $0_{1b}$ from phase shift transparent portion 602 is shown as graph 1302. The intensity of the portion of light 108 is proportional to the square of the vector sum of the amplitudes of electromagnetic energies. Thus, the distribution of the intensity of the portion of light 108 at plane X 1202 is shown as a graph 1310, which is the square of the vector sum of the amplitudes of electromagnetic energies shown in graphs 402, 802, and 1302.

However, because the distribution of the electromagnetic energy shown in graph 802 is produced when the negative and the positive half order lights $-\frac{1}{2}_b$ and $+\frac{1}{2}_b$ have some separation between them (see FIG. 12), the distribution of the electromagnetic energy shown in graph 1302 does have an impact on the distribution of the intensity of the portion of light 108 at plane X 1202 as shown at graph 1310. Here, because the zero order leakage light $0_{1b}$ and the negative and the positive half order lights $-\frac{1}{2}_b$ and $+\frac{1}{2}_b$ that emerge from phase shift transparent portion 602 are substantially in phase with one another, the vector sum of the amplitudes of the electromagnetic energies shown in graphs 802 and 1302 is larger than the amplitude of the electromagnetic energy shown in graph 1302. A comparison between graphs 1310 (of FIG. 13B) and 1304 (of FIG. 13A) shows that both graphs are characterized by two peaks. However, in graph 1310, peak L 1308 has a height "h'", while peak K 1306 has height h, where h'>h.

FIG. 13C shows the contribution of the zero order leakage light $0_{1b}$ that emerges from phase shift transparent portion 602 to the diffraction pattern at plane Y 1204. As in FIGS. 13A and 13B, the distribution of the electromagnetic energy of the half order portions of light $-\frac{1}{2}_a$ and $+\frac{1}{2}_a$ from first transparent portion 202 is shown as graph 402 from FIG. 4; the distribution of the electromagnetic energy of the half order portions of light $-\frac{1}{2}_b$ and $+\frac{1}{2}_b$ from phase shift transparent portion 602 is shown as graph 802 from FIG. 8; and the distribution of the electromagnetic energy of the zero order leakage light $0_{1b}$ from phase shift transparent portion 602 is shown as graph 1302. The intensity of the portion of light 108 is proportional to the square of the vector sum of the amplitudes of electromagnetic energies. Thus, the distribution of the intensity of the portion of light 108 at plane X 1202 is shown as a graph 1312, which is the square of the vector sum of the amplitudes of electromagnetic energies shown in graphs 402, 802, and 1302.

However, because the distribution of the electromagnetic energy shown in graph 802 is produced when the negative and the positive half order lights $-\frac{1}{2}_b$ and $+\frac{1}{2}_b$ have some separation between them (see FIG. 12), the distribution of the electromagnetic energy shown in graph 1302 does have an impact on the distribution of the intensity of the portion of light 108 at plane Y 1204 as shown at graph 1308. Here, because the zero order leakage light $0_{1b}$ and the negative and the positive half order lights $-\frac{1}{2}_b$ and $+\frac{1}{2}_b$ that emerge from phase shift transparent portion 602 are substantially out of phase with one another, the vector sum of the amplitudes of the electromagnetic energies shown in graphs 802 and 1302 is smaller than the amplitude of the electromagnetic energy shown in graph 1302. A comparison between graphs 1312 (of FIG. 13C) and 1304 (of FIG. 13A) shows that both graphs are characterized by two peaks. However, in graph 1312, peak L 1308 has a height "h''", while peak K 1306 has height h, where h''<h.

Figure 14A:
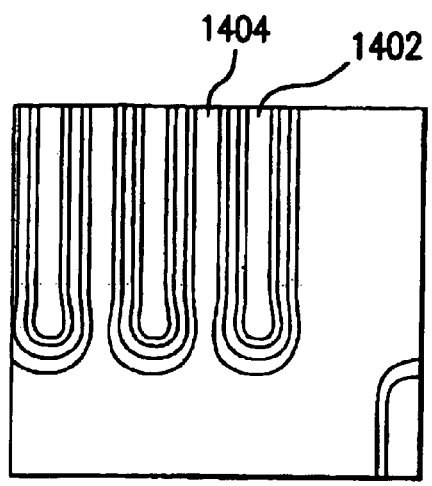
FIGS. 14A, 14B, and 14C are drawings of scanning electron microscope images that show the detrimental effects that zero order leakage has on printed lines and spaces.
Figure 14B:
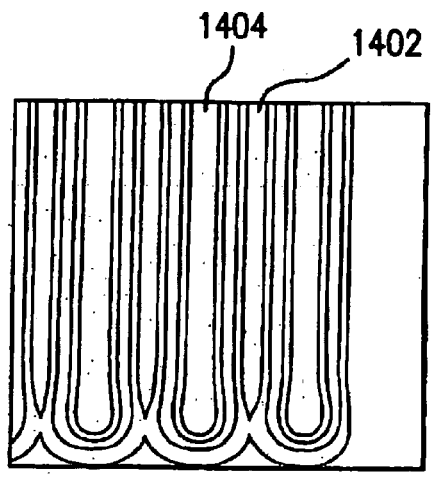
Figure 14C:
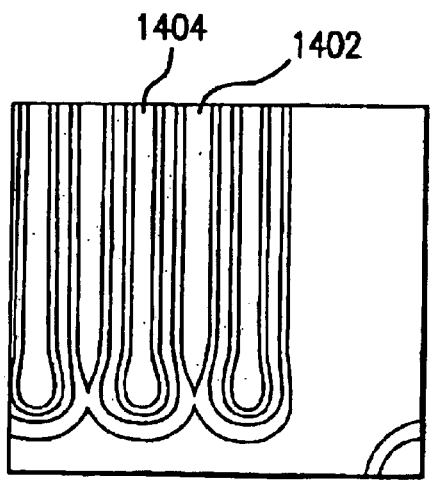

FIGS. 14A, 14B, and 14C are drawings of scanning electron microscope images that show the detrimental effects that zero order leakage has on printed lines and spaces. FIG. 14A corresponds to lines formed from photoresist exposed at plane W 120. Line 1402 corresponds to photoresist exposed at an intensity corresponding to peak K 1306 on graph 1304. Line 1404 corresponds to photoresist exposed at an intensity corresponding to peak L 1308 on graph 1304. Lines 1402 and 1404 have uniform widths. FIG. 14B corresponds to lines formed from photoresist exposed at plane X 1202. Line 1402 corresponds to photoresist exposed at an intensity corresponding to peak K 1306 on graph 1310. Line 1404 corresponds to photoresist exposed at an intensity corresponding to peak L 1308 on graph 1310. Line 1402 has a more narrow width than line 1404. FIG. 14C corresponds to lines formed from photoresist exposed at plane Y 1204. Line 1402 corresponds to photoresist exposed at an intensity corresponding to peak K 1306 on graph 1312. Line 1404 corresponds to photoresist exposed at an. intensity corresponding to peak L 1308 on graph 1312. Line 1402 has a larger width than line 1404. The skilled artisan will appreciate that variations in linewidths formed on wafer 114 can have a detrimental effect on the electrical or electronic characteristics of the device being fabricated. Of particular concern is the change in location of the variation that depends upon whether the exposed photoresist is above or below the nominal focal plane.

Figure 15:
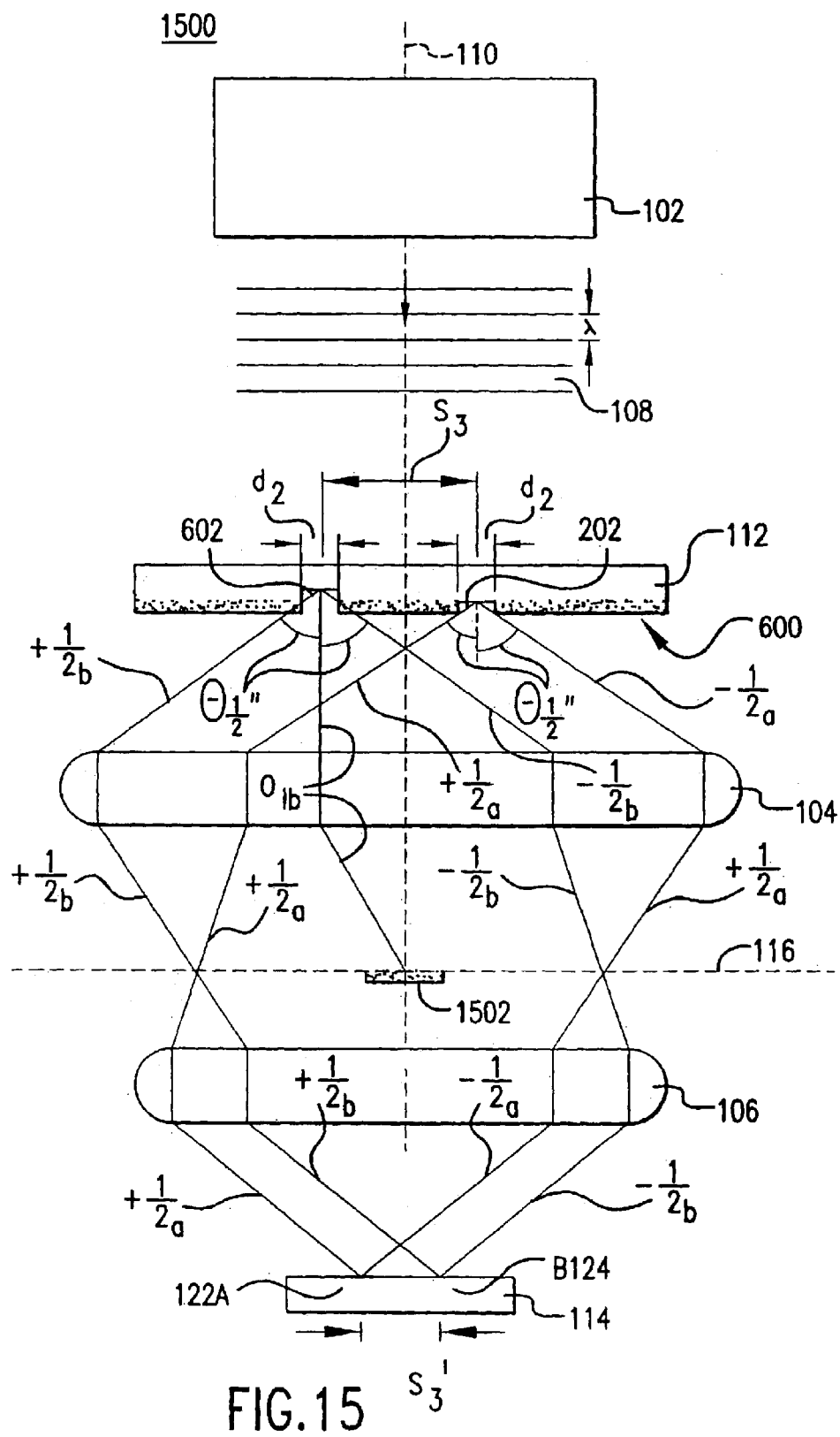
FIG. 15 is a block diagram illustration of a photolithographic system 1500 in the manner of the present invention.

FIG. 15 is a block diagram illustration of a photolithographic system 1500 in the manner of the present invention. Photolithographic system 1500 comprises illumination source 102, first conditioning lens 104, a blocking aperture 1502, and second conditioning lens 106. Illumination source 102 is capable of causing a light 108 to pass through alternating phase shift mask 600 of reticle 112. First conditioning lens 104 is capable of causing light 108 from alternating phase shift mask 600 to converge at pupil plane 116. Blocking aperture 1502 is positioned substantially in pupil plane 116 and is capable of blocking a portion of light 108. Second conditioning lens 106 is capable of redirecting light 108 from pupil plane 116 to a photoresist (shown here on wafer 116).

Blocking aperture 1502 can be supported by a supporting arm (not shown) connected between blocking aperture 1502 and another portion of photolithographic system 1500, an air bearing device (not shown), a magnetic levitation device (not shown), etc. Blocking aperture 1502 is translucent to wavelength λ of light 108. Preferably, blocking aperture 1502 is opaque to wavelength λ of light 108.

Blocking aperture 1502 is positioned at a zero order portion of light 108 at pupil plane 116. Typically, the area of blocking aperture 1502 is greater than or equal to the area of the zero order portion (e.g., $0_{1b}$) of light 108 at pupil plane 116. Preferably, blocking aperture 1502 has a shape that substantially corresponds to the shape of the zero order portion of light 108 at pupil plane 116. The area can be a function of the numerical aperture of first conditioning lens 104 or of the partial coherence of light 108 between first conditioning lens 104 and pupil plane 116.

Figure 16:
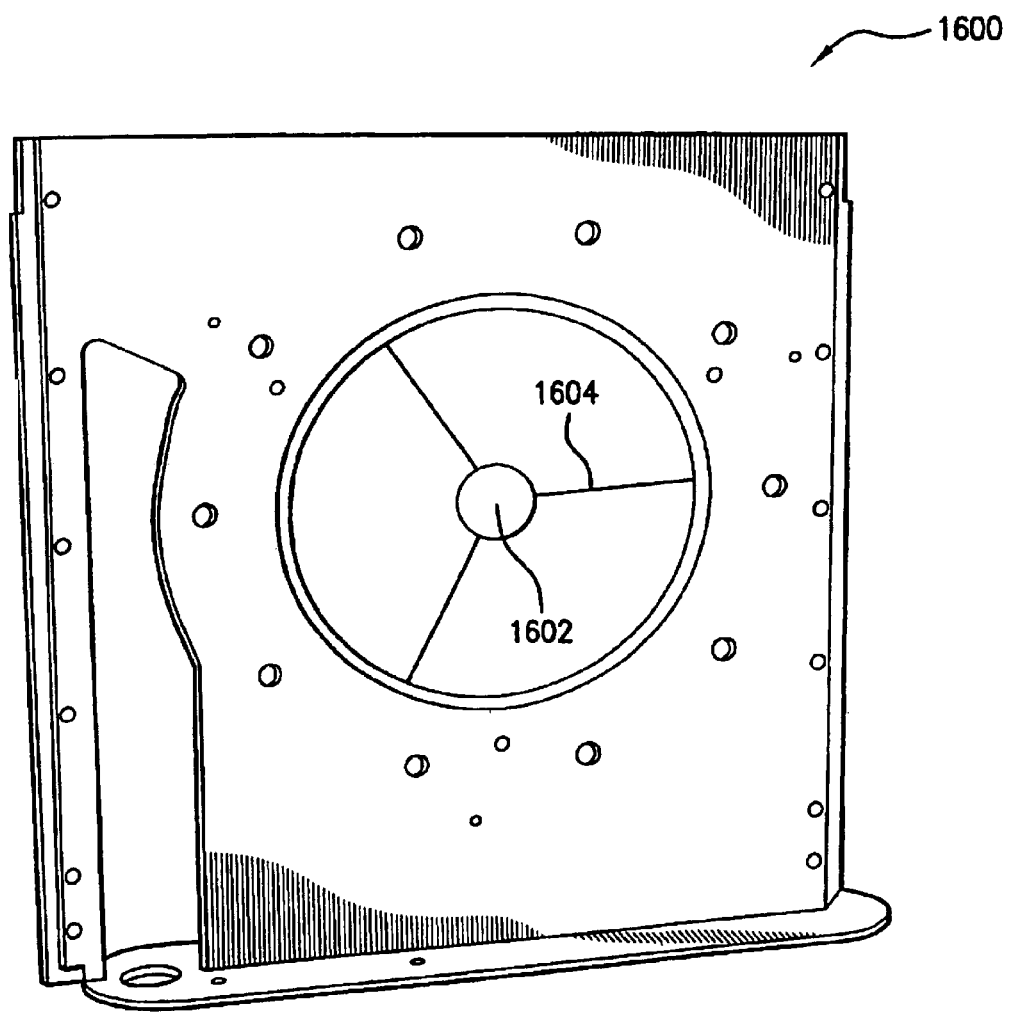
FIG. 16 is a blocking aperture 1600 in the manner of the present invention.

FIG. 16 is a blocking aperture 1600 in the manner of the present invention. Blocking aperture 1600 includes an object 1602 translucent to wavelength λ of light 108 and means to support object 1602 substantially at a zero order portion (e.g., $0_{1b}$) of light 108 at pupil plane 116 of a photolithographic system using alternating phase shift mask 600 (e.g., photolithographic system 1500). The means to support can include, but is not limited to, a supporting arm 1604 connected between object 1602 and the photolithographic system (not shown), an air bearing device (not shown), and a magnetic levitation device (not shown). Preferably, object 1602 is opaque to wavelength λ of light 108.

Typically, the area of object 1602 is greater than or equal to the area of the zero order portion (e.g., $0_{1b}$) of light 108 at pupil plane 116. Preferably, object 1602 has a shape that substantially corresponds to the shape of the zero order portion of light 108 at pupil plane 116. The area can be a function of the numerical aperture of a conditioning lens of the photolithographic system (e.g., first conditioning lens 104) or of the partial coherence of light 108 of the photolithographic system.

Figure 17:
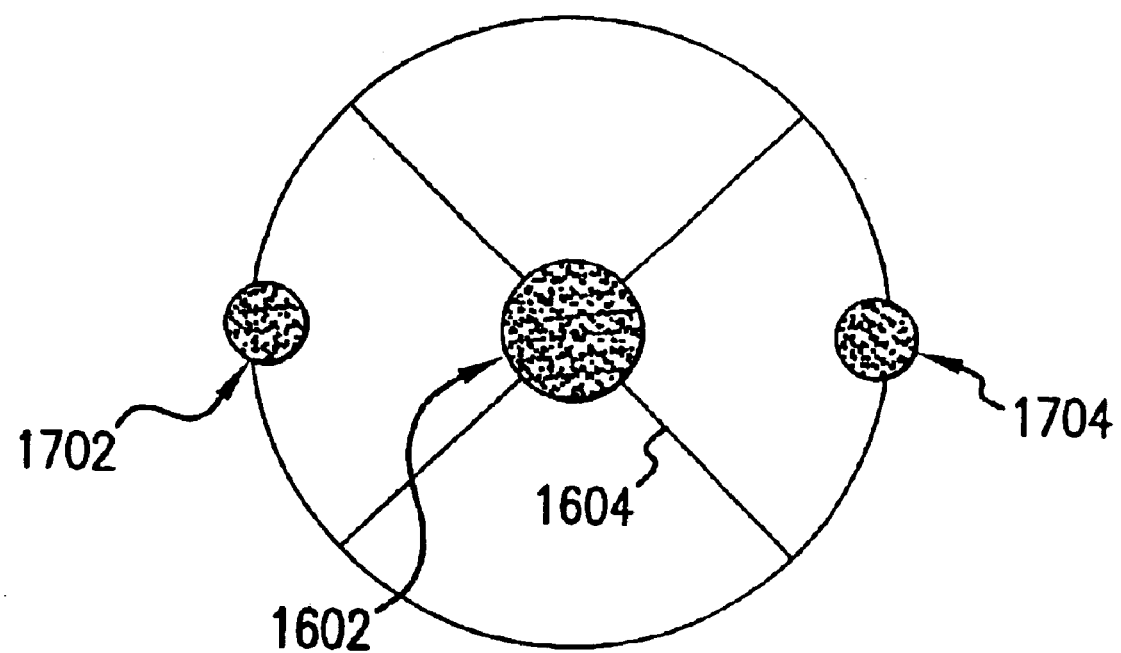
FIG. 17 shows blocking aperture 1700 with a second object 1702 and a third object 1704 and means to support second and third objects 1702 and 1704 at a phase error portion of light 108 at pupil plane 116.

FIG. 17 shows blocking aperture 1700 with a second object 1702 and a third object 1704 and means to support second and third objects 1702 and 1704 at a phase error portion of light 108 at pupil plane 116. Second and third objects 1702 and 1704 are translucent to wavelength λ of light 108. The skilled artisan will appreciate that additional phase errors are possible, particularly as a function of a pitch of a pattern of reticle 112 used by the photolithographic system. These other phase errors can be associated with other fractional orders of light such as, for example, a three-quarters order of light. Blocking aperture 1700 is shown for a pattern having linewidths of 90 nanometers at a pitch of 270 nanometers. As the pitch is increased, second and third objects 1702 and 1704 move closer towards object 1602.

Figure 18:
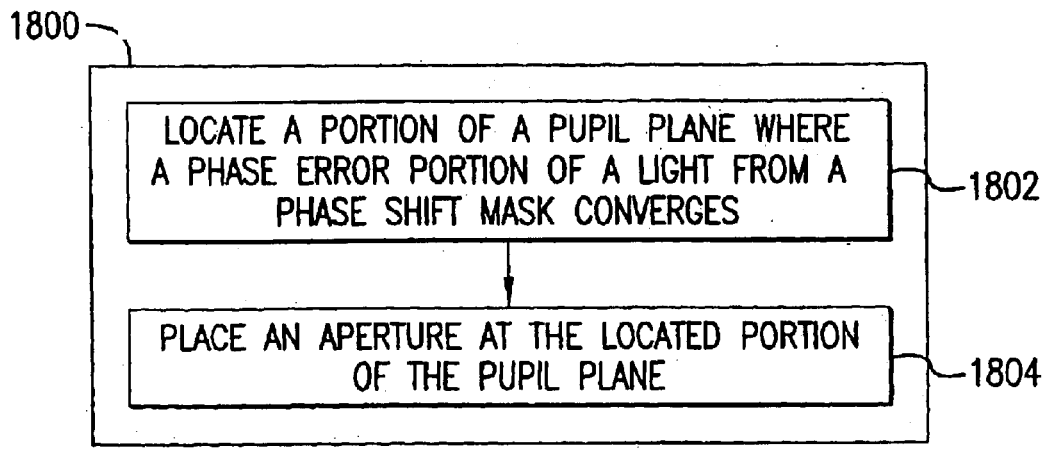
FIG. 18 shows a flow chart of a method 1800 for improving the imaging performance in a photolithographic system.

FIG. 18 shows a flow chart of a method 1800 for improving the imaging performance in a photolithographic system. In method 1800, at a step 1802, a portion of a pupil plane where a phase error portion of a light from a phase shift mask converges is located. At a step 1804, an aperture is placed at the located portion of the pupil plane. The phase error portion of the light can be a zero order portion of the light. Preferably, the aperture is opaque to a wavelength of the light. Preferably, the aperture allows another portion of the light to pass through the pupil plane. Preferably, the area of the aperture corresponds to the area of the located portion of the pupil plane. Preferably, the shape of the aperture corresponds to the shape of the located portion of the pupil plane.

Figure 19:
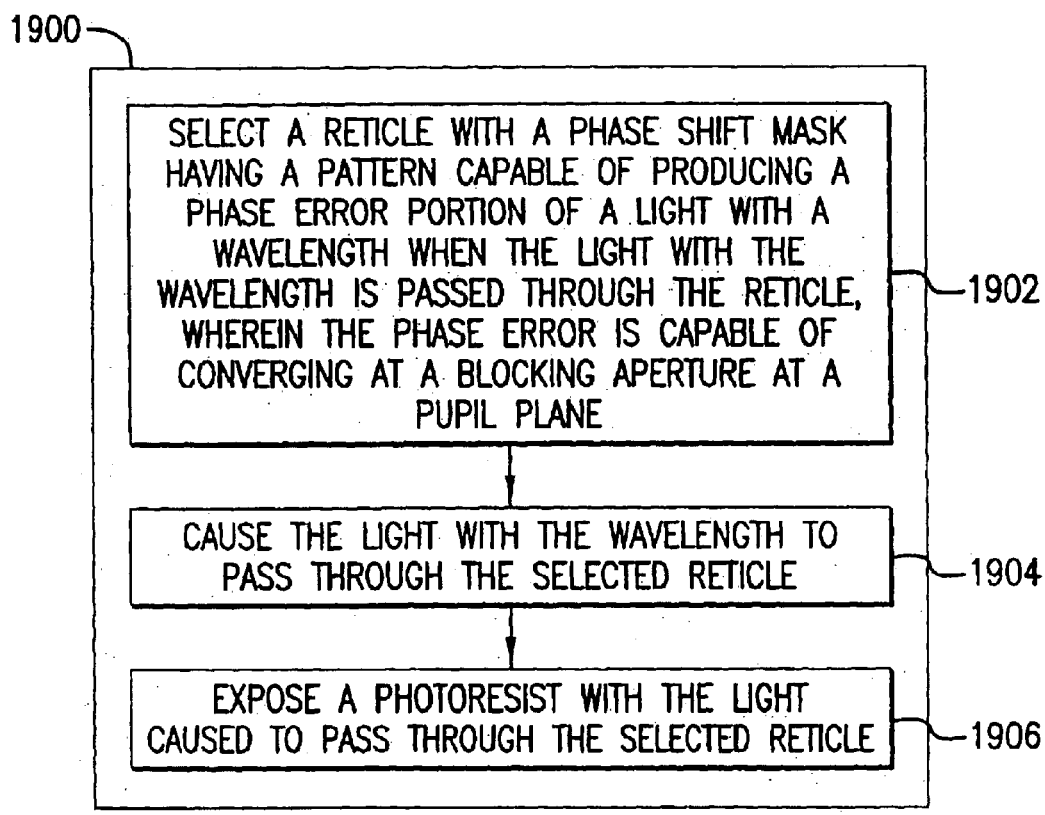
FIG. 19 shows a flow chart of a method 1900 for improving the imaging performance in a photolithographic system.

FIG. 19 shows a flow chart of a method 1900 for improving the imaging performance in a photolithographic system. In method 1900, at a step 1902, a reticle with a phase shift mask having a pattern capable of producing a phase error portion of a light with a wavelength when the light with the wavelength is passed through the reticle is selected. The phase error is capable of converging at a blocking aperture at a pupil plane. At a step 1904, the light with the wavelength is caused to pass through the selected reticle. Preferably, at a step 1906, a photoresist is exposed with the light caused to pass through the selected reticle.

Conclusion

While an embodiment of the present invention has been described above, it should be understood that it has been presented by way of example only, and not limitation. It will be understood by those skilled in the art that various changes in form and detail may be made therein without departing from the spirit and scope of the invention as defined in the appended claims. Thus, the breadth and scope of the present invention should not be limited by the above-described exemplary embodiment, but should be defined only in accordance with the following claims and their equivalents.

What is claimed is:

1. A blocking aperture for a photolithographic system using a phase shift mask and an illumination source capable of producing a light at a wavelength, comprising:

a first object that blocks a first portion of the light at the wavelength, the first object positioned at a pupil plane of the photolithography system and at a zero order portion of the light; and a second object separate from the first object that blocks a second portion of the light at the wavelength, the second object positioned at the pupil plane and at a fractional order portion of the light that corresponds to a phase error that is a function of a pitch of a pattern of a reticle used in conjunction with the photolithographic system;

wherein the phase shift mask has at least one of a recess formed into a surface of the phase shift mask and a rise formed on the surface.

2. The blocking aperture of claim 1, wherein the first object has a first area and the zero order portion of the light at the pupil plane has a second area, the first area one of greater than and equal to the second area.

3. The blocking aperture of claim 2, wherein the first object has a first shape and the zero order portion of the light at the pupil plane has a second shape, the first shape substantially corresponding to the second shape.

4. The blocking aperture of claim 2, wherein the first area is a function of a numerical aperture of a conditioning lens of the photolithographic system.

5. The blocking aperture of claim 2, wherein the first area is a function of a partial coherence of the light of the photolithographic system.

6. A photolithographic system, comprising:
an illumination source capable of causing a light at a wavelength to pass through a phase shift mask;
a first conditioning lens capable of causing the light from the phase shift mask to converge at a pupil plane;
a blocking aperture positioned at the pupil plane and having a first object that blocks a first portion of the light at the wavelength at a zero order portion of the light and a second object seperate from the first object that blocks a second portion of the light at the wavelength at a fractional order portion of the light that corresponds to a phase error that is a function of a pitch of a pattern of a reticle used in conjunction with the photolithographic system; and
a second conditioning lens capable of redirecting the light from the pupil plane to a photoresist;
wherein the phase shift mask has at least one of a recess formed into a surface of the phase shift mask and a rise formed on the surface.

7. The photolithographic system of claim 6, wherein the first object has a first area and the zero order portion of the light has a second area, the first area one of greater than and equal to the second area.

8. The photolithographic system of claim 7, wherein the first object has a first shape and the zero order portion of the light has a second shape, the first shape substantially corresponding to the second shape.

9. The photolithographic system of claim 8, wherein the first area is a function of a numerical aperture of the first conditioning lens.

10. The photolithographic system of claim 8, wherein the first area is a function of a partial coherence of the light between the first conditioning lens and the pupil plane.

11. In a photolithographic system using a phase shift mask and an illumination source capable of producing a light at a wavelength, a method for improving an imaging performance, comprising the steps of:
(1) locating a portion of a pupil plane where a phase error portion of the light from the phase shift mask converges; and
(2) placing a blocking aperture at the located portion of the pupil plane;
wherein the aperture has a first object that blocks a first portion of the light at the wavelength and a second object separate from the first object that blocks a second portion of the light at the wavelength, the first object positioned at the pupil plane and at a zero order portion of the light, the second object positioned at the pupil plane and at a fractional order portion of the light that corresponds to a specific phase error that is a function of a pitch of a reticle used in conjunction with the photolithography system, and wherein the phase shift mask has at least one of a recess formed into a surface of the phase shift mask and a rise formed on the surface.

12. The method of claim 11, wherein an area of the aperture corresponds to an area of the portion of the pupil plane.

13. The method of claim 12, wherein a shape of the aperture corresponds to a shape of the portion of the pupil plane.

14. In a photolithographic system, a method for improving an imaging performance, comprising the steps of:
(1) selecting a reticle with a phase shift mask having a pattern configured to produce a phase error portion of a light with a wavelength when the light with the wavelength is passed through the reticle, wherein the phase error portion is configured to converge at a blocking aperture at a pupil plane; and
(2) causing the light with the wavelength to pass through the reticle;
wherein the blocking aperture has a first object that blocks a first portion of the light with the wavelength and a second object separate from the first object that blocks a second portion of the light with the wavelength, the first object positioned at the pupil plane and at a zero order portion of the light, the second object positioned at the pupil plane and at a fractional order portion of the light that corresponds to a specific phase error that is a function of a pitch of a reticle used in conjunction with the photolithography system, and wherein the phase shift mask has at least one of a recess formed into a surface of the phase shift mask and a rise formed on the surface.

15. The photolithographic system of claim 14, further comprising:
(3) exposing a photoresist with the light caused to pass through the reticle.

* * * * *